(12) United States Patent
Komenko et al.

(10) Patent No.: US 11,015,980 B2
(45) Date of Patent: May 25, 2021

(54) INFRARED RADIATION SENSORS AND METHODS OF MANUFACTURING INFRARED RADIATION SENSORS

(71) Applicant: Infineon Technologies AG, Neubiberg (DE)

(72) Inventors: Vladislav Komenko, Dresden (DE); Heiko Froehlich, Radebeul (DE); Thoralf Kautzsch, Dresden (DE); Andrey Kravchenko, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 260 days.

(21) Appl. No.: 16/194,674

(22) Filed: Nov. 19, 2018

(65) Prior Publication Data

US 2019/0162600 A1    May 30, 2019

(30) Foreign Application Priority Data

Nov. 24, 2017  (DE) .......................... 102017221076.1

(51) Int. Cl.
  *G01J 5/34*     (2006.01)
  *G01J 5/40*     (2006.01)
  *H01L 31/18*    (2006.01)
  *H01L 27/146*   (2006.01)
  *G01J 5/08*     (2006.01)

(52) U.S. Cl.
  CPC .............. *G01J 5/34* (2013.01); *G01J 5/0853* (2013.01); *G01J 5/40* (2013.01); *H01L 27/14649* (2013.01); *H01L 31/18* (2013.01)

(58) Field of Classification Search
  CPC .... G01J 5/40; G01J 5/0853; G01J 5/58; G01J 5/34; H01L 31/18; H01L 27/14649
  USPC ....... 73/338.1, 338.2, 338.4, 339.14, 339.15, 73/341.8, 342
  See application file for complete search history.

(56) References Cited

U.S. PATENT DOCUMENTS

| | | | |
|---|---|---|---|
| 5,844,238 A | 12/1998 | Sauer et al. | |
| 5,929,440 A | 7/1999 | Fisher | |
| 6,737,648 B2 | 5/2004 | Fedder et al. | |
| 9,291,507 B1 | 3/2016 | Wang et al. | |
| 10,670,468 B2* | 6/2020 | Kang | G01J 5/34 |
| 2004/0232503 A1* | 11/2004 | Sato | G01L 9/0042 257/417 |

(Continued)

*Primary Examiner* — Robert R Raevis
(74) *Attorney, Agent, or Firm* — Harrity & Harrity, LLP

(57) ABSTRACT

An infrared radiation sensor comprises a substrate, a membrane formed in or at the substrate, a first counter electrode, a second counter electrode, and a composite comprising at least two layers of materials having different coefficients of thermal expansion. At least a portion of the membrane forms a deflectable electrode and the deflectable electrode is electrically floating. A first capacitance is formed between the deflectable electrode and the first counter electrode, and a second capacitance is formed between the deflectable electrode and the second counter electrode. The membrane comprises the composite or is supported at the substrate by the composite. The membrane comprises an absorption region configured to cause deformation of the composite by absorbing infrared radiation, the deformation resulting in a deflection of the deflectable electrode, which causes a change of the first and second capacitances.

23 Claims, 16 Drawing Sheets

(56) References Cited

U.S. PATENT DOCUMENTS

2010/0243904 A1* 9/2010 Mueller .................... G01J 5/40
                                                      250/349
2011/0049368 A1* 3/2011 Streuber ............... G01J 5/0853
                                                      250/341.6

* cited by examiner

INFRARED RADIATION SENSORS AND METHODS OF MANUFACTURING INFRARED RADIATION SENSORS

RELATED APPLICATION

This application claims priority under 35 U.S.C. § 119 to German Patent Application No. 102017221076.1, filed on Nov. 24, 2017 the content of which is incorporated by reference herein in its entirety.

TECHNICAL FIELD

The present disclosure relates to infrared radiation sensors and methods of manufacturing infrared radiation sensors. In particular, the present disclosure relates to MEMS (Micro-Electro Mechanical Systems) infrared radiation sensors and methods of manufacturing infrared radiation sensors using MEMS technologies.

BACKGROUND

Infrared imaging has a number of well-established industrial, commercial and military applications, such as security, law enforcement surveillance and industrial and environmental monitoring. The ability of detecting infrared radiation establishes a broad spectrum of applications, beginning with temperature measurements up to a precise characterization of all kinds of inorganic and organic substances by spectroscopic methods, such as IR and Raman spectroscopy.

In infrared cameras, bolometers may be used as radiation detectors. In such bolometers, detection takes place indirectly by converting absorbed light energy into heat. The heat results in an intensification of scattering of freely movable electrons within a solid state body. Thereby, an increase of the electric resistance may be detected as a signal. Highly-doped silicon, both amorphous and polycrystalline, in the form of a membrane may be used as a heat sensitive resistive element. The surface area and the thickness of the membrane may be adapted or optimized to achieve a maximum efficient radiation reception. Bolometers may have a pixel size of 17×17 $\mu m^2$ and a thermal contrast (NETD=Noise Equivalent Temperature Difference) of 30 mK to 50 mK.

Generally, bolometers may comprise two electrical contacts which are connected to the membrane at two opposite sides thereof so as to operate the membrane structure as a resistor. This may result in a relatively strong heat dissipation through the contact structures, which may be implemented using metal studs, and, therefore, the sensitivity may be reduced. Miniaturization of bolometers is directly linked with a reduction of the active surface area of the membrane.

Other infrared imagers may use MEMS differential capacitive infrared sensors within a sensor array. Such differential capacitive infrared sensors may include a bimaterial deflectable electrode element anchored to a top surface of an integrated circuit substrate and a surface electrode fabricated on the top surface of the integrated circuit substrate and positioned below the deflectable electrode element. The surface electrode and the deflectable electrode element may be separated by a gap to form a first variable capacitor having a first capacitance value. In addition, an infrared transparent sealing cap electrode may be provided. A first bias voltage may be applied to the surface electrode and a second bias voltage may be applied to the sealing cap electrode. A differential capacitance monitor is physically coupled to the bimaterial deflectable electrode element, to the surface electrode and to the sealing cap electrode. The differential capacitance monitor is to monitor a magnitude of the differential between the first capacitance value of the first variable capacitor and the second capacitance value of the second variable capacitor.

Infrared capacitance sensors may be composed of a bimaterial strip which changes the position of one plate of a sensing capacitor in response to temperature changes due to absorbed incident thermal radiation. The bimaterial strip may be composed of two materials with a large difference in thermal expansion coefficients. The plates of the sensing capacitor face each other in parallel to a substrate plane and are electrically connected to a detection circuit.

SUMMARY

Examples of the present disclosure provide an infrared radiation sensor comprising a substrate; a membrane formed in or at the substrate, at least a portion of the membrane forming a deflectable electrode, the deflectable electrode being electrically floating; a first counter electrode; a second counter electrode; and a composite comprising at least two layers of materials having different coefficients of thermal expansion. A first capacitance is formed between the deflectable electrode and the first counter electrode. A second capacitance is formed between the deflectable electrode and the second counter electrode. The membrane comprises the composite or is supported at the substrate by the composite. The membrane comprises an absorption region configured to cause deformation of the composite by absorbing infrared radiation, the deformation resulting in a deflection of the deflectable electrode, which causes a change of the first and second capacitances.

Examples of the present disclosure provide an infrared radiation sensor comprising a substrate having a main surface defining a substrate plane; a membrane formed in or at the substrate, at least a portion of the membrane forming a deflectable electrode; and a counter electrode. The deflectable electrode and the counter electrode face each other laterally with respect to the substrate plane, wherein a capacitance is formed between the deflectable electrode and the counter electrode. The membrane comprises a composite comprising at least two layers of materials having different coefficients of thermal expansion. The composite comprises an absorption region configured to cause deformation of the opposite by absorbing infrared radiation, the deformation resulting in a deflection of the deflectable electrode relative to the counter electrode, which causes a change of the capacitance.

Examples of the present disclosure provide methods of manufacturing such infrared radiation sensors.

BRIEF DESCRIPTION OF THE DRAWINGS

Examples of the disclosure will be described using the accompanying drawings, in which.

DETAILED DESCRIPTION

Figure 1A:
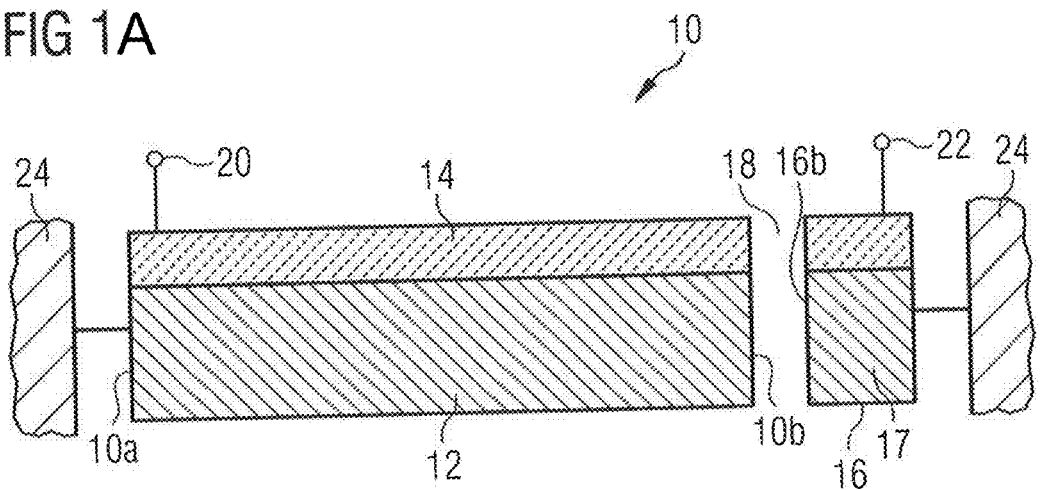
FIG. 1A to FIG. 1C show schematic cross-sectional views for explaining examples of infrared radiation sensors having electrodes facing each other in a lateral direction.

In the following, examples of the present disclosure will be described in detail using the accompanying drawings. It is to be pointed out that the same elements or elements having the same functionality are provided with the same or similar reference numbers and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to those skilled in the art that other examples may be practiced without these specific details. In other instances, well-known structures and devices are shown in block diagrams form rather than in detail in order to avoid obscuring examples described herein. In addition, features of the different examples described hereinafter may be combined with each other, unless specifically noted otherwise.

Examples of the present disclosure relate to infrared radiation sensors comprising a substrate. Generally, the substrate may include one or two main surfaces, i.e. surfaces having a larger square dimension than the other surfaces thereof. The main surface of the substrate may define a substrate plane, i.e. a substrate plane may be laid through the main surface of the substrate even if the surface comprises irregularities. Generally, the substrate may include two main surfaces and the substrate plane may be parallel to the two main surfaces of the substrate. A length direction and a width direction may be parallel to the subject plane, while a thickness direction may be vertical (or perpendicular) to the subject plane. Generally, the terms "vertical" and "lateral" as used herein may be vertical and lateral with respect to the substrate plane.

Examples of the present disclosure provide infrared radiation sensors which may be manufactured using MEMS technologies in a cost effective manner. Examples provide MEMS infrared radiation sensors. Examples permit miniaturization and integration of infrared detectors in microelectronic, wherein CMOS (Complementary Metal-Oxide Semiconductor) compatible materials and processes may be used in manufacturing the sensors. Examples of the present disclosure permit low-energy infrared radiation to be received and converted into a useful signal with high efficiency.

According to examples of the present disclosure, infrared radiation is detected indirectly by measuring an electrical capacitance. In examples of the present disclosure, less electrical contacts to the sensitive element of the sensor are provided. In examples, the area of the electrical contact can be reduced for a better thermal isolation. In examples, a radiation sensitive membrane may be arranged within an evacuated cavity so that thermal losses due to convective flow of heat and heat dissipation through the atmosphere may be reduced. In examples, infrared sensors may be implemented with a high thermal contrast with an NETD up to 1 mK.

In examples of the present disclosure, the sensitive element is a composite comprising two layers of materials having different coefficients of thermal expansion, which are arranged on top of each other in direct mechanical contact with each other. In examples, the sensitive element comprises a material combination of silicon and silicon oxide or silicon dioxide. The sensitive element may be supported at one position thereof and may be movable at other positions thereof. Thus, the sensitive element may deflect in case of temperature changes due to the different coefficients of thermal expansion of the layers of the composite. In examples, the composite is a bimaterial composite comprising a first layer of a material having a first coefficient of thermal conductivity and a second layer of a material having a second coefficient of thermal conductivity.

Figure 1B:
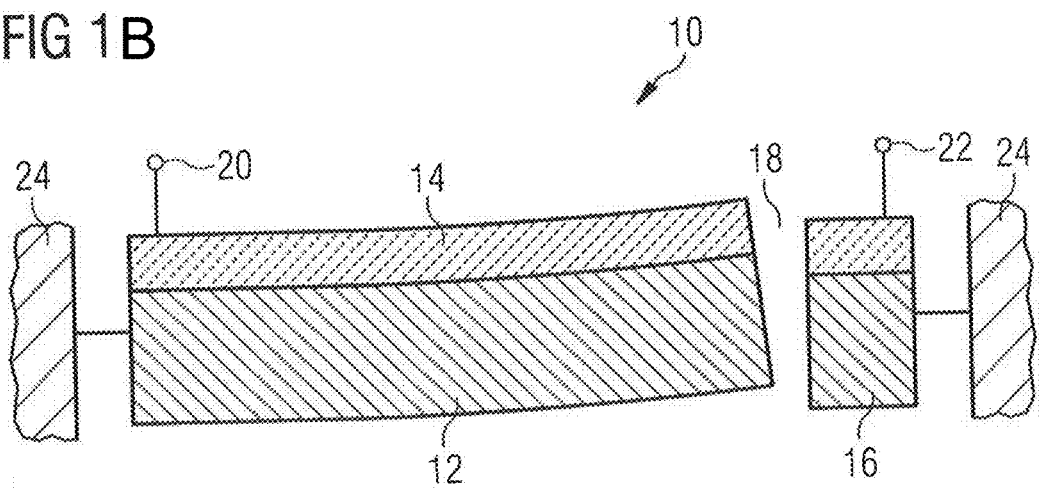

FIGS. 1A and 1B show an example of an infrared radiation sensor comprising a membrane 10. The membrane 10 comprises a semiconductor layer 12 and an oxide layer 14 formed on top of the silicon layer 12. The semiconductor layer may be a silicon layer and the oxide layer may be a $SiO_2$ layer. The membrane forms a sensitive element is fixed at one side 10a thereof to a substrate 24 and freely movable at the other side 10b thereof. Thus, the membrane 10 forms a cantilever beam and the semiconductor layer 12 forms a deflectable electrode. The free end 10b has a lateral surface facing a lateral surface 16b of a stator 16. The stator 16 comprises a semiconductor layer 17 forming a stationary electrode. The stator 16 may be formed in the same material layers as the sensitive element, but is fixed to the substrate 24 and does not comprise a movable portion. In examples, the stator does not comprises a movable portion since the extension of the stator in the direction of the longitudinal extension of the cantilever beam is substantially less than the extension of the cantilever beam in this direction. The semiconductor materials 12, 17 of the cantilever beam 10 and the stator 16 may be doped to be electrically conductive enough to form electrodes of a capacitor. To be more specific, the free end 10b and the lateral side face 16b of stator 16 face each other laterally via an air gap 18 and, therefore, the deflectable electrode and the stationary electrode form a capacitor. A contact 20 for contacting the deflectable electrode 12 and a contact 22 for contacting the stationary electrode 16 may be provided.

Figure 1C:
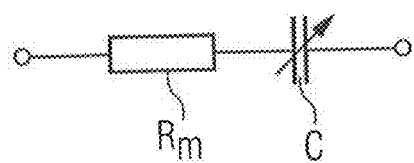

FIG. 1A shows the sensor element in a state in which the deflectable electrode is not deflected, which may be a state of equilibrium or quiescent state. FIG. 1B shows the sensor element under the influence of heat. FIG. 1C shows an electric equivalent circuit of the system with a variable capacitance C between the laterally facing surfaces of the semiconductor layers 12 and 17 and the electric resistance $R_m$ of the semiconductor layers.

Incident infrared radiation may be absorbed within the semiconductor layer 12 by interaction with free charge carriers within the doped semiconductor layer. Since the charge carriers aim to assume a state of lower energy, they are relaxed due to interaction with photons in the solid state body. Thus, the membrane is heated. Since the membrane comprises a combination of layers of materials having different coefficients of thermal expansion, such as Si and $SiO_2$, which are in direct contact with each other, heating the membrane results in a deformation and, therefore, reflection of the membrane, as shown schematically in FIG. 1B.

For example, silicon has a coefficient of thermal expansion of about $26 \times 10^{-7} K^{-1}$ and $SiO_2$ has a coefficient of thermal expansion of about $5 \times 10^{-7} K^{-1}$. Thus, the coefficient of silicon is about five times higher than that of $SiO_2$.

Connecting a voltage source to the contacts 20 and 22 results in the equivalent circuit shown in FIG. 1C. Since the thermal expansion is a reversible process, the deflection of the sensitive element 10 varies with varying radiation intensity. Thereby, the capacitance between cantilever beam 10 and stator 16 varies and the capacitance may be read out electrically. To be more specific, the capacitance may change since the overlapping area of the deflectable electrode and the stationary electrode when viewed in the lateral direction changes. In the example shown in FIGS. 1A to 1C, the overlapping area is maximum in the state of FIG. 1A.

In examples, the membrane may be pre-deflected so that the capacitance between the deflectable electrode (i.e. the sensitive element) and the stator is not maximum in the state of equilibrium. Thus, read out may take place in a more linear region of the capacitance variation. Pre-deflection may be achieved by depositing an oxide layer of the membrane to the semiconductor layer at increased temperatures so that mechanical stress develops between the layers when cooling down to room temperature. A pre-deflection of the membrane may be provided with respect to all examples of the present disclosure.

The semiconductor layer 12 represents an absorption region of the membrane and may be doped with phosphor or boron in order to allow for absorption of the infrared radiation. In order to increase interaction of the incident photons with free charge carriers within the semiconductor a high concentration of the dopants is desired.

Accordingly, FIGS. 1A to 1C show an example of an infrared radiation sensor, in which a membrane is formed in or at a substrate 24. The semiconductor layer 12 of the membrane 10 forms a deflectable electrode, and the semiconductor layer 17 of the stator 16 forms a counter electrode. The semiconductor layer or region 17 of the stator 16 is electrically isolated from the semiconductor layer 12. The semiconductor layer 12 and semiconductor layer 17 face each other laterally with respect to the substrate plane, wherein a capacitance C is formed between the same and, therefore, between the deflectable electrode 12 and the counter electrode 16. The membrane comprises a composite comprising the semiconductor layer 12 and the oxide layer 14 in direct mechanical contact with each other. The semiconductor layer 12 of the cantilever beam 10 represents an absorption region configured to cause deformation of the composite by absorbing infrared radiation, the deformation resulting in a deflection of the deflectable electrode 12 relative to the counter electrode 17, which causes a change of the capacitance C.

According to the example, the capacitance or capacitor is formed by electrodes facing each other laterally. Thus, a vertical distance between the deflectable electrode and a bottom of a cavity above which the deflectable electrode may be formed is not decisive for the capacitance. Thus, the height of the cavity in the thickness direction of the substrate may be increased and, therefore, the risk that pull-in effects occur may be reduced.

Generally, the layer of the composite, through which the infrared radiation is incident into the absorption region, may act as an antireflection layer in addition to the purpose of allowing for deformation upon heating. For example, the oxide layer 14 may also serve as an antireflection layer and, to this end the thickness of the antireflection layer may be adapted to be in conformity with the antireflection condition:

$$d = k \frac{\lambda_0}{2}$$

wherein k=2n−1, wherein d is the thickness of the layer, n is a natural number equal ≥1 and $\lambda_0$ is the wavelength of the incident infrared radiation.

According to the example shown in FIGS. 1A to 1C, the membrane and, therefore, the flexible electrode 10, is in the form of a cantilever beam fixed at one end 10a thereof. One side face of the cantilever beam, such as lateral side face 10b may laterally face a lateral side face of a stationary electrode, such as side face 16b. In examples, plural lateral side faces of the flexible electrode may laterally face side faces of one or more stationary electrodes. For example, stator 16 may be provided to substantially surround membrane 10 so that the front side and the back side of the flexible electrode shown in FIGS. 1A to 1B also laterally face side faces of the stator 16, which act as stationary electrodes. Thus, change of capacitance in case of deflection may be increased.

In examples, a counter electrode laterally faces the deflectable electrode at several lateral margins of the deflectable electrode, wherein a membrane support is coupled to the membrane in a region spaced from the lateral margins of the membrane when viewed in plan view onto the substrate plane. In examples, the membrane support may be coupled to the membrane in a region spaced from all lateral margins of the membrane when viewed in plan view onto the substrate. In examples, the membrane support may be coupled to the membrane in a central region of the membrane in plan view onto the substrate plane.

Figure 2A:
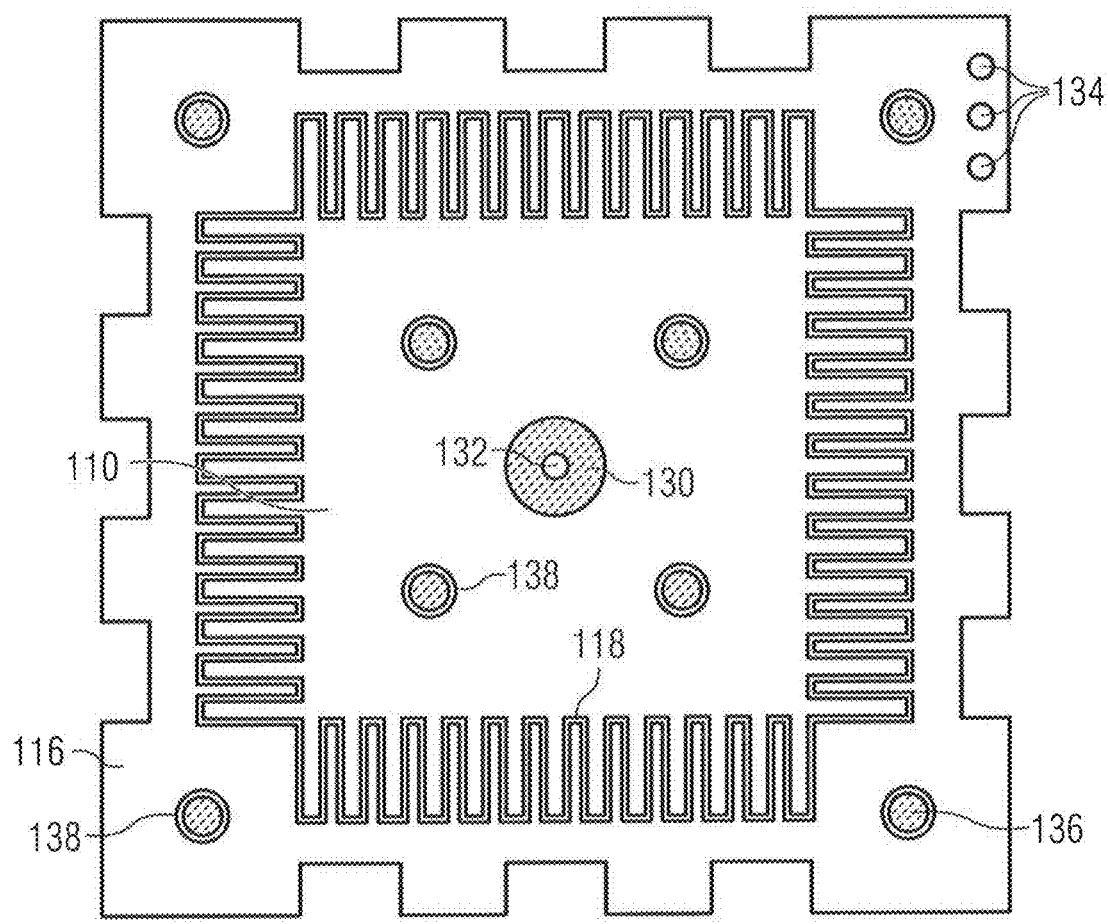
FIG. 2A and FIG. 2B show a schematic top view and a schematic cross-sectional view of an example of an infrared radiation sensor having electrodes facing each other in a lateral direction and a centrally supported membrane.
Figure 2B:
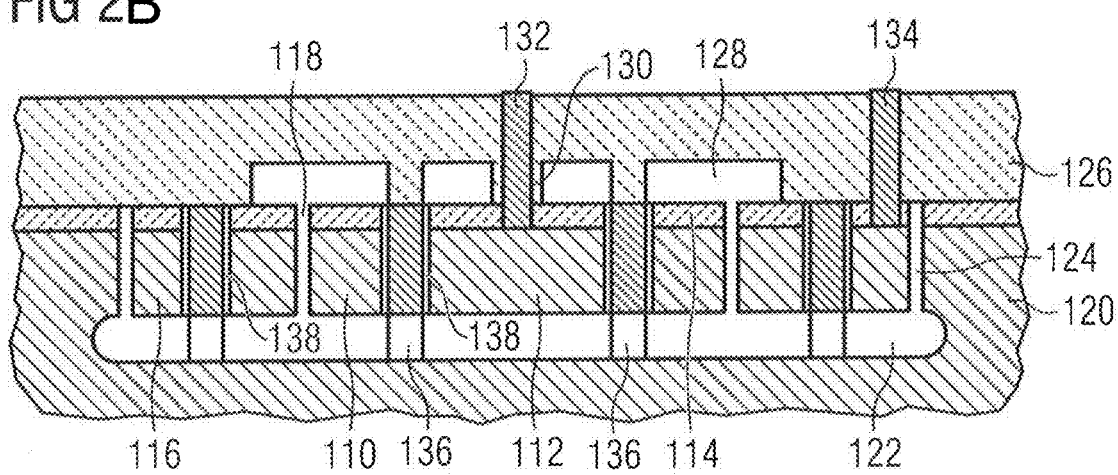

FIG. 2A shows an example of an infrared radiation sensor comprising a membrane supported at a central portion thereof. The sensor comprises a membrane 110. The membrane 110 comprises a doped semiconductor layer 112 and an oxide layer 114 in direct mechanical contact with the doped semiconductor layer 112. The doped semiconductor layer 112 and the oxide layer 114 provide a composite layer comprising two layers of materials having different coefficients of thermal expansion as explained above. The sensor further comprises a stationary electrode 116 forming a stator. The membrane 110 and the stator 116 are separated from each other by a narrow trench 118. In examples, the width of the trench and, therefore, the distance between opposing lateral surfaces of the membrane 110 and the stationary electrode 116 is at most 500 nm. Thus, a capacitor structure is formed between opposing lateral surfaces of the doped semiconductor regions of the membrane 110 and the stationary electrode 116. As shown in FIG. 2B, the stationary electrode 116 and the membrane 112 may be formed in the same semiconductor layer.

The membrane 110 and the stationary electrode 116 are electrically decoupled from a substrate 120 in which the same are formed. To be more specific, the stator 116 and the membrane 110 are formed above a cavity 122. A trench 124 laterally surrounds the stator 116 to electrically decouple the stator 116 from the substrate 120. The membrane 110 and the stator 116 are mounted to a lid 126. The lid 126 is not shown in FIG. 2A in order not to hide the below structures. In addition, FIG. 2A only shows the structures within the outer margin of the stator 116. The cavity 122 may have a depth of about 1 μm. Above the membrane 110 a further cavity 128 may be formed within the lid 126. The membrane 110 is fixed to the lid 126 via a membrane support. The membrane support is formed by an oxide cylinder 130 extending between the lid 126 and the oxide layer 114. A contact 132 for contacting the doped semiconductor layer 112 of the membrane 110 extends through the oxide cylinder 130. A further contact 134 for contacting the doped semiconductor region of the stationary electrode 116 extends through the lid 126 and the oxide layer 114. As shown in FIG. 2A, the contact 134 may be split into a plurality of contacts.

In the example shown in FIGS. 2A and 2B, the membrane 110 is supported and electrically contacted in a center portion thereof, i.e. a portion separated from all lateral margins of the membrane. In examples, the portion at which the membrane is supported may be the geometrical center of the membrane in a top view onto the substrate plane.

In the example shown, pylons 136 are provided to stabilize the lid 126. The pylons 136 extend through openings 138 formed in the membrane 110 and the stator 116. The pylons 136 may be formed of oxide columns mechanically connecting the lid 126 to the bottom of the cavity 122. The pylons 136 are electrically and mechanically decoupled from the membrane 110 and the stator 116 by trenches surrounding the pylons due to the larger dimensions of the openings 138 when compared to the pylons 136.

In order to increase the active area of the capacitor between the stator 116 and the membrane 110, the trench between them may be meander-shaped in plan view. In examples, the trench may be formed in a meander shape by etching in an easy manner. Lid 126 may seal the sensitive structure of the sensor with respect to the outside atmosphere. Thus, the pressure within the cavities 122 and 128 may be adjusted by means of oxide deposition processes. In order to achieve a better thermal isolation, in examples, a low pressure may be adjusted within the cavities. In examples, the cavities may be evacuated. Generally, the lid 126 and the oxide layer 114 may be transparent for infrared radiation.

The portions of the membrane 110 spaced apart from the fixed portion thereof represent a deflectable electrode. The doped semiconductor layer 112 represents an absorption region.

As explained above, incident infrared radiation causes a rise of temperature of the composite of the membrane (doped semiconductor layer 112 and oxide layer 114) resulting in a deformation of the composite, wherein the deformation results in a deflection of the deflectable electrode. To be more specific, the margins of membrane 110 will bend up in case of a rise of temperature and, therefore, the capacitance between the deflectable electrode and the stator electrode 116 will change. This change in capacitance may be detected as a measure for the incident infrared radiation.

Since the only mechanical contact to the membrane 110 is via the membrane support 130 and the contact 132, heat dissipation from the membrane 110 may be low. Thus, sensitivity of the sensor may be increased.

Figure 3A:
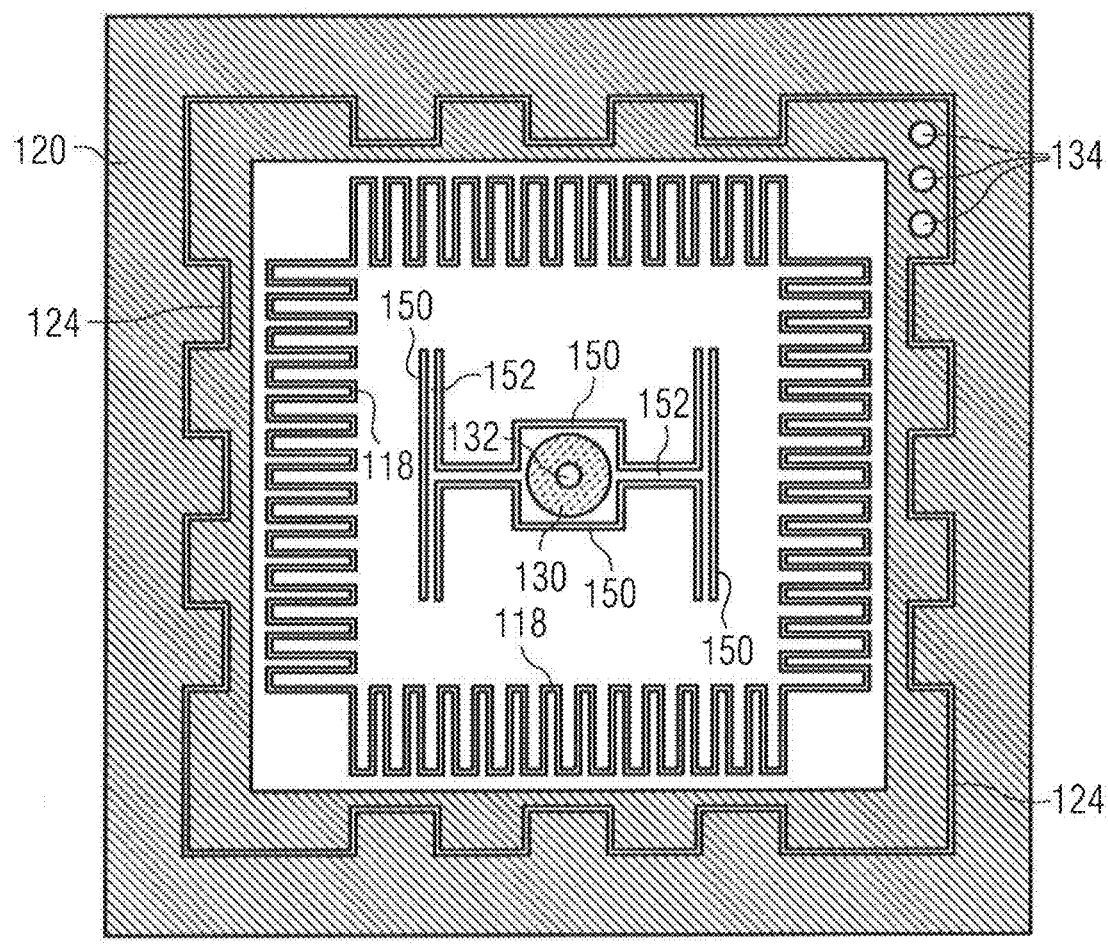
FIG. 3A and FIG. 3B show a schematic top view and a schematic cross-sectional view of another example of an infrared radiation sensor having electrodes facing each other in a lateral direction and a centrally supported membrane.
Figure 3B:
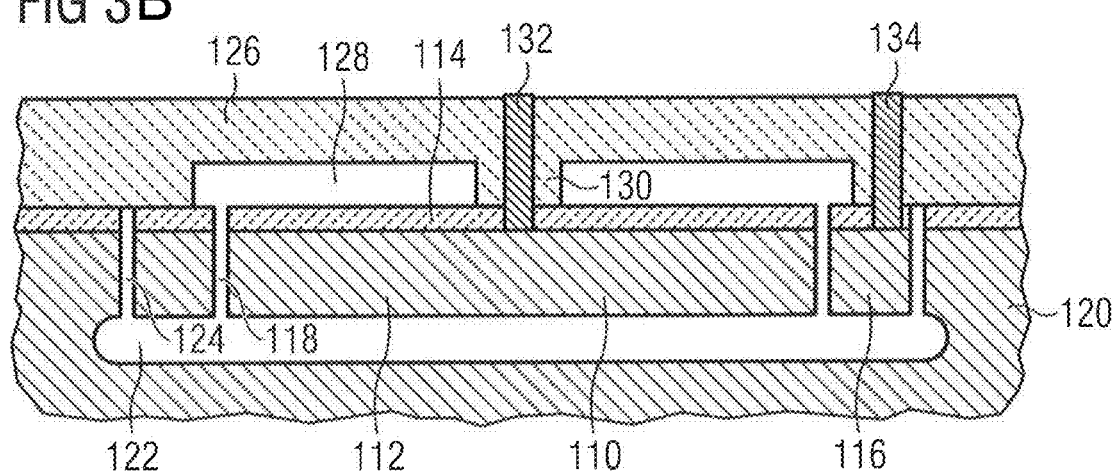

In examples, additional trenches may be provided in the membrane to reduce a thermal influence of the region coupled to the membrane support on other regions of the membrane. One such example is shown in FIGS. 3A and 3B. As shown in FIG. 3A, trenches 150 are provided in the region where the membrane is supported by the membrane support 130. As shown in FIG. 3A, trenches 150 are provided to form lands or bars 152, via which the portion of the membrane, which is coupled to the membrane support 130, is mechanically connected to other portions of the membrane. The trenches 150 may penetrate the membrane and are not shown in FIG. 3B for clarity reasons. The bars 152 may include first and second bars extending from the membrane support 130 in opposite directions. The bars 152 may include a third bar extending from the distal end of the first bar perpendicular to the first bar in opposite directions. The bars 152 may include a fourth bar extending from the distal end of the second bar perpendicularly to the second bar in opposite directions. To form such bars, the trenches 150 may include four trenches as shown in FIG. 3A. In other words, the trenches 150 may be etched into the membrane to provide a spring structure surrounding the membrane support and extending to the sides of the membrane. Such a spring structure may be formed by etching trenches and may serve to increase the thermal resistance of the membrane.

In examples, the pressure within the infrared radiation sensor, such as within the cavities surrounding the membrane, is kept low in order to reduce the thermal conductivity within the cavity. Thus, heat dissipation from the sensitive structure can be decreased and sensitivity can be increased.

Operation of such a sensor has been simulated using finite element analysis and showed a substantial deflection of the margins of the membrane supported at a central portion thereof. Such a deflection can be detected as a change in capacitance between the deflectable electrode formed by portions of membrane 110 and the stator electrode 116. The change of capacitance can be detected using an appropriate detector connected to the terminals 132 and 134.

Figure 4:
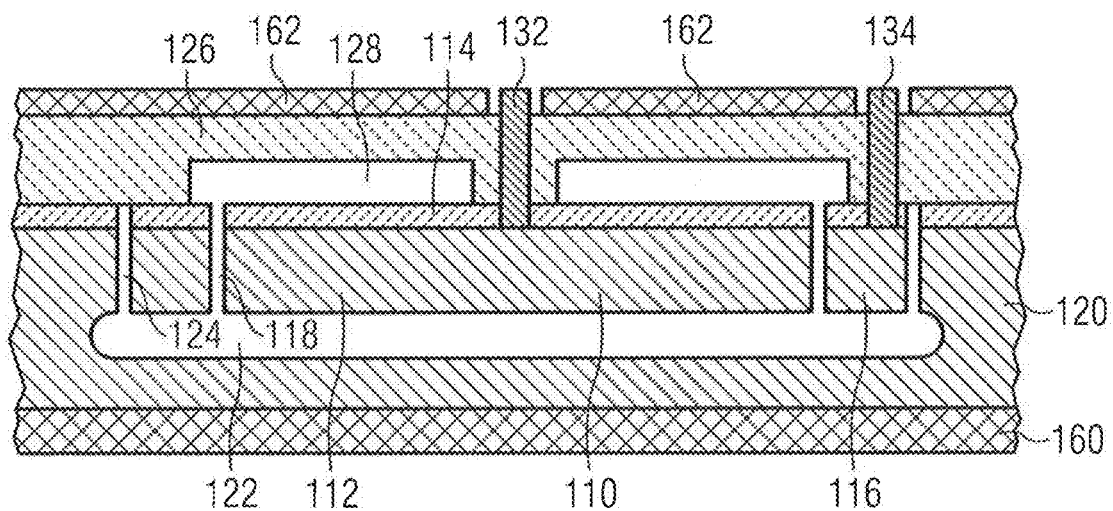
FIG. 4 shows a modification of the sensor of FIG. 3B.

FIG. 4 shows a schematic cross-sectional view of a modification of the sensor shown in FIG. 3B. As shown in FIG. 4, an optical reflector 160 is provided at the backside of substrate 120, i.e. on the side facing away from the side on which lid 126 is provided. Moreover, an optical filter 162 is provided on lid 126. The optical filter 162 may be an infrared filter blocking wavelengths different from infrared. The optical reflector 160 may be reflective for infrared radiation so that infrared radiation passing through the absorption region and not being absorbed therein will be reflected back into the absorption region. Thus, efficiency may be improved using the optical reflector. Moreover, sensitivity may be improved using the optical filter 162. Corresponding optical reflectors and filters may be provided in each of the examples described herein. Corresponding filters and reflectors may be provided in all examples of the present disclosure.

As described above, in examples of the present disclosure, at least a portion of the membrane forms a deflectable electrode and the deflectable electrode is provided with an electrical contact to permit detection of the capacitance between the deflectable electrode and the counter electrode. In other examples of the present disclosure, the deflectable electrode is electrically floating. In the context of this disclosure, "electrically floating" means that the deflectable electrode is not provided with a galvanic connection to any circuitry outside the deflectable electrode. In such examples, the infrared radiation sensor may comprise a first counter electrode and a second counter electrode, wherein a first capacitance is formed between the deflectable electrode and the first counter electrode and a second capacitance is formed between the deflectable electrode and the second counter electrode.

Figure 5:
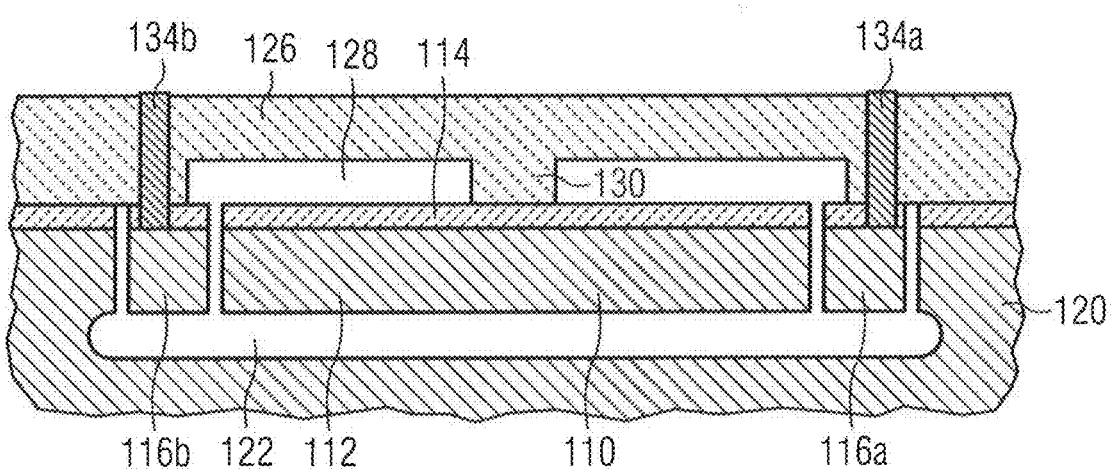
FIG. 5 shows a schematic cross-sectional view of an example of an infrared radiation sensor comprising two counter electrodes and a floating deflectable electrode.

An example of an infrared radiation sensor comprising a floating deflectable electrode and lateral capacitances between the deflectable electrode and two counter electrodes is shown in FIG. 5. The sensor shown in FIG. 5 is similar to the sensor shown in FIG. 4 with the following exceptions. There is no galvanic electric contact to the silicon layer 112 of membrane 110. The membrane support 130 is formed by a solid oxide cylinder in this case. There is no contact extending through the membrane support 130. Rather, two separate contacts 134a and 134b are provided for two separate counter electrodes 116a and 116b. Counter electrodes 116a and 116b may be electrically isolated from each other by additional trenches formed within the semiconductor layer in which the membrane 110 and the counter electrodes 116a and 116b are formed. In examples, such trenches may separate the counter electrode 116 shown in FIGS. 2A and 3A into two halves. Accordingly, a first capacitance is formed between a lateral side face of the deflectable electrode 110 and the counter electrode 116a and a second capacitance is formed between another lateral side face of the deflectable electrode 110 and the second counter electrode 116b. The first and second capacitances are connected in series through the doped silicon layer 112. A detector may be coupled to the contacts 134a and 134b to detect the capacitance of this series connection of series capacitances and/or changes thereof. Thus, incident infrared radiation may be detected by a detector connected to the contacts 134a and 134b.

In examples, in which the deflectable electrode is electrically floating, thermal isolation of the deflectable electrode may be improved and, therefore, sensitivity may be increased.

In the examples described above referring to FIGS. 1-5, lateral capacitances are formed between lateral side faces of a deflectable electrode and one or more stationary counter electrodes. In such examples, the area of the capacitor electrodes facing each other may be varied an increased in an easy manner by shaping the trench separating the electrodes. An example is the meander shaped trench shown in FIGS. 2A and 3A.

In other examples of the present disclosure, vertical capacitances are formed between surfaces of a deflectable electrode and surfaces of first and second counter electrodes facing each other in a vertical direction.

Figure 6:
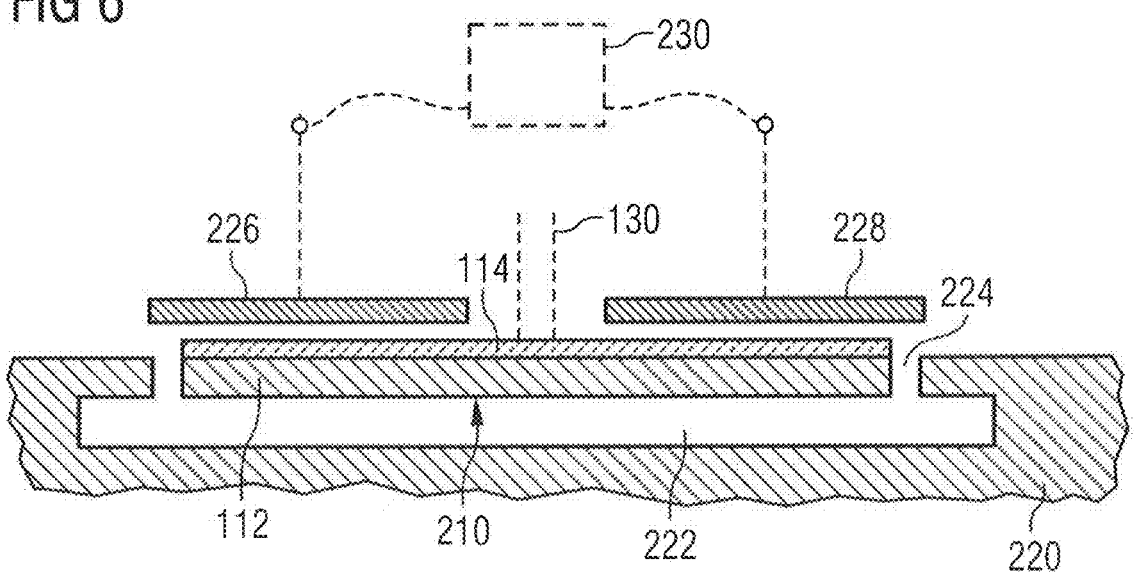
FIG. 6 shows a schematic cross-sectional view of an example of an infrared radiation sensor with vertical read-out.

FIG. 6 shows a schematic cross-sectional view of an infrared radiation sensor comprising a membrane 210 formed in a substrate 220. In examples, the membrane 210 is separated from the substrate 220 by a cavity 222 and trenches 224. The membrane 210 may be supported at a central portion thereof using a membrane support 130 as described above. There is no other mechanical or electrical connection between the membrane 210 and the substrate 220. The membrane 210 comprises a composite of a doped semiconductor layer 112 and an oxide layer 114. Thus, incident infrared radiation will cause a deformation of the membrane 210, portions of which form a deflectable electrode. The sensor comprises a first counter electrode 226 and a second counter electrode 228. A first vertical capacitance is formed between portions of the membrane 210 forming a deflectable electrode and the first counter electrode 226, and a second vertical capacitance is formed between other portions of the membrane 210 forming a deflectable electrode and the second counter electrode 228. The first and second counter electrodes 226, 228 may be electrically connected to a detection circuit 230 as indicated in FIG. 6 in broken lines.

A deformation of the deflectable electrode 210 causes a change of the first and second capacitances. Again, there is a series connection between the first capacitance and the second capacitance via the doped semiconductor layer 112. In the example shown in FIG. 6, the oxide layer 114 contributes to the capacitances. In other examples, the oxide layer 114 may be arranged on the side of the membrane 112 facing away from the counter electrodes 226, 228.

Figure 7:
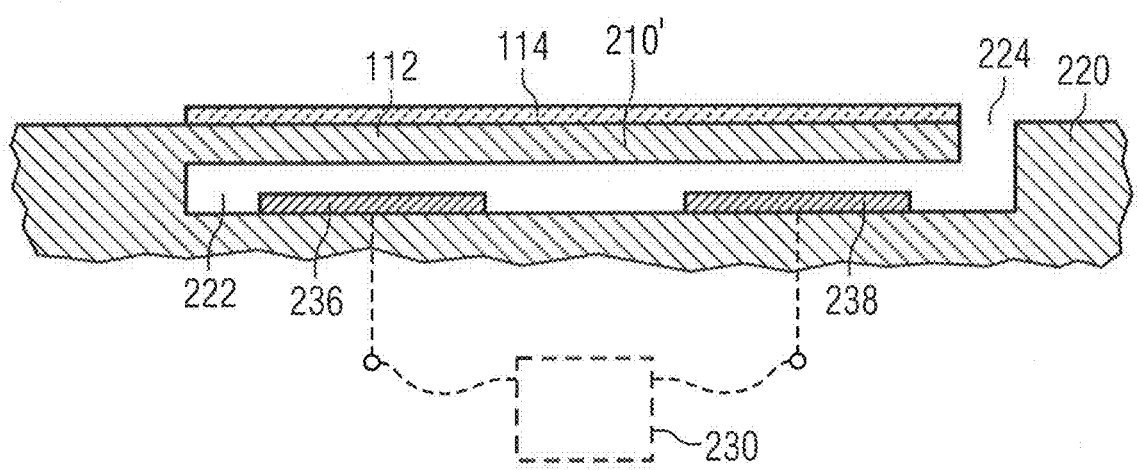
FIG. 7 shows a schematic cross-sectional view of another example of an infrared radiation sensor with vertical read-out.
Figure 8:
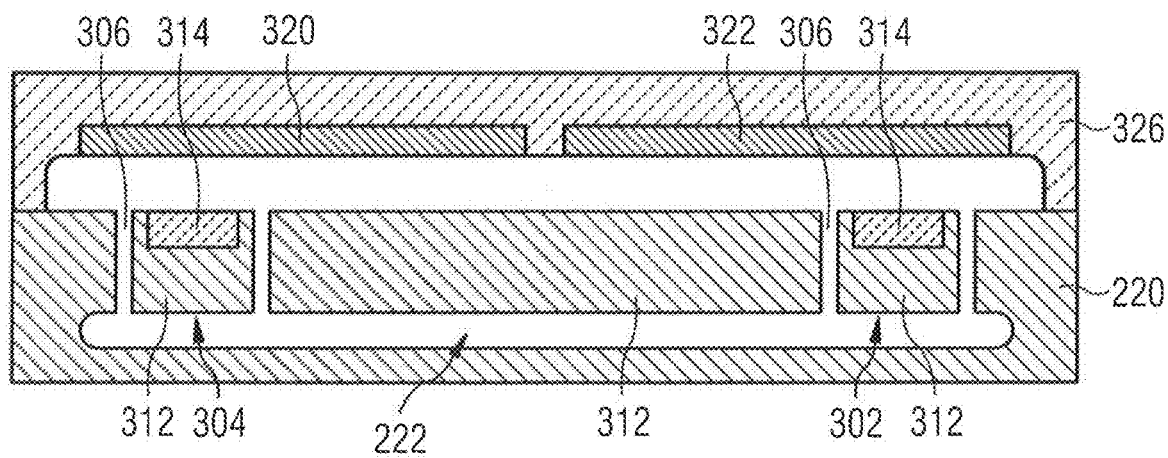
FIG. 8 shows a schematic cross-sectional view of an example of an infrared radiation sensor comprising counter electrodes formed in a lid of the sensor.

FIG. 7 shows a schematic cross-sectional view of another example of an infrared radiation sensor with vertical readout. A membrane 210' in the form of a cantilever beam is formed in a substrate 220 and separated from the substrate by a cavity 222 and a trench 224. Again, the membrane 210' may include a doped silicon layer 112 and an oxide layer 114 and, therefore, comprises a layer composite having at least two layers of materials with different coefficients of thermal expansion. The infrared radiation sensor further includes a first counter electrode 236 and a second counter electrode 238, which are provided on the bottom of the cavity 222. The first and second counter electrodes 236, 238 face respective portions of the membrane 210' in a vertical direction. The first and second counter electrodes 236, 238 may be connected to a detection circuit 230 as indicated in FIG. 7 in broken lines. As explained above in detail, infrared radiation incident in doped semiconductor layer 112 will result in a deformation of the semiconductor layer. Such deformation results in a deflection of the membrane 210' and, therefore, in a change of the first and second capacitances. Such change may be detected by the detection circuit 230 via a change of the series capacitance formed by the first and second capacitances, which are coupled through the doped semiconductor layer 112.

In examples, the portion of the membrane forming the deflectable electrode is deflectable vertically with respect to the substrate plane, wherein the deformation of the composite causes a vertical deflection of the portion of the deflectable electrode relative to the first counter electrode and the second counter electrode. In examples, the deflectable electrode and the first counter electrode face each other laterally with respect to the substrate plane and the deflectable electrode and the second counter electrode face each other laterally with respect to the substrate plane. In other examples, the deflectable electrode and the first counter electrode face each other vertically with respect to the substrate plane and the deflectable electrode and the second counter electrode face each other vertically with respect to the substrate plane.

In the above examples, portions of the membrane form a deflectable electrode and the membrane comprises the composite. In other examples, the membrane is supported at the substrate by the composite. In such examples, the membrane may be formed of a single layer and may be coupled to the substrate via the composite, which comprises at least two layers of materials having different coefficients of thermal expansion. In such examples, the composite may comprise a first cantilever beam and a second cantilever beam, wherein the first cantilever beam and the second cantilever beam bear the membrane, wherein a free end of the first cantilever beam is coupled to a first side of the membrane and a free end of the second cantilever beam is coupled to a second side of the membrane, which is opposite to the first side in a lateral direction with respect to the substrate plane. One such example is now described referring to FIGS. 8 to 16B.

As shown in FIGS. 8 to 11, an infrared radiation sensor comprises a substrate 220. A cavity 222 is formed in the substrate 220 and defines a semiconductor layer of the substrate. First and second cantilever beams 302, 304 and a membrane 310 are structured in this semiconductor layer by trenches 306, which penetrate the semiconductor layer. Each cantilever beam 302, 304 comprises a composite of a doped semiconductor layer 312 and an oxide layer 314. The membrane 310 includes the doped silicon layer 312 but, in this example, does not include the oxide layer 314.

Figure 10:
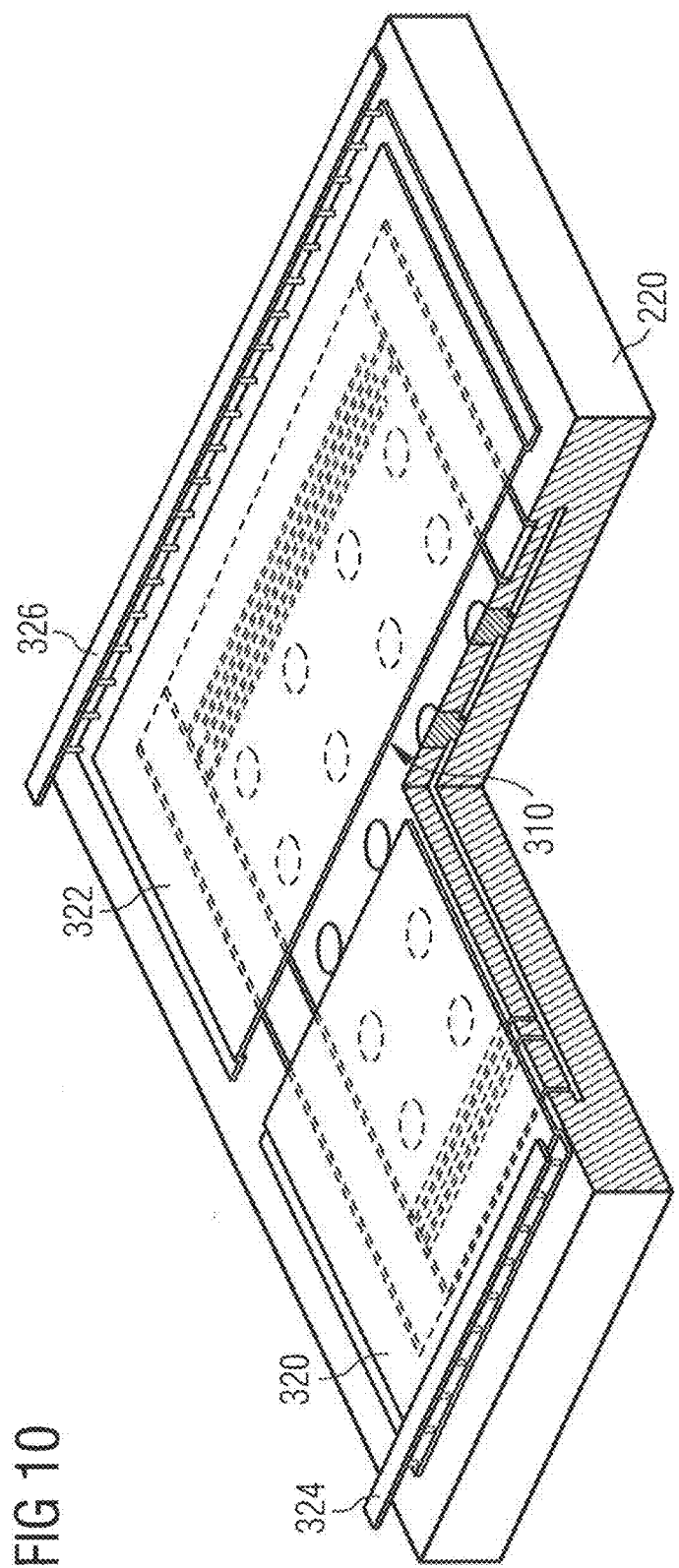
FIG. 10 shows a schematic three-dimensional view of portions of the sensor of FIGS. 8 and 9, wherein portions are cut away.

The sensor further comprises a first counter electrode 320 and a second counter electrode 322. The first and second counter electrodes 320, 322 are formed in a lid 326 of the infrared radiation sensor, which seals the cavity in which the membrane 310 and the cantilever beams 302, 304 are formed. Contacts 324 and 326 as shown in FIG. 10 may be provided to connect the counter electrodes 320, 322 to a detection circuit. In the schematic perspective view of FIG. 10, lid 326 is shown transparent in order not to hide the structures below the same.

Figure 9:
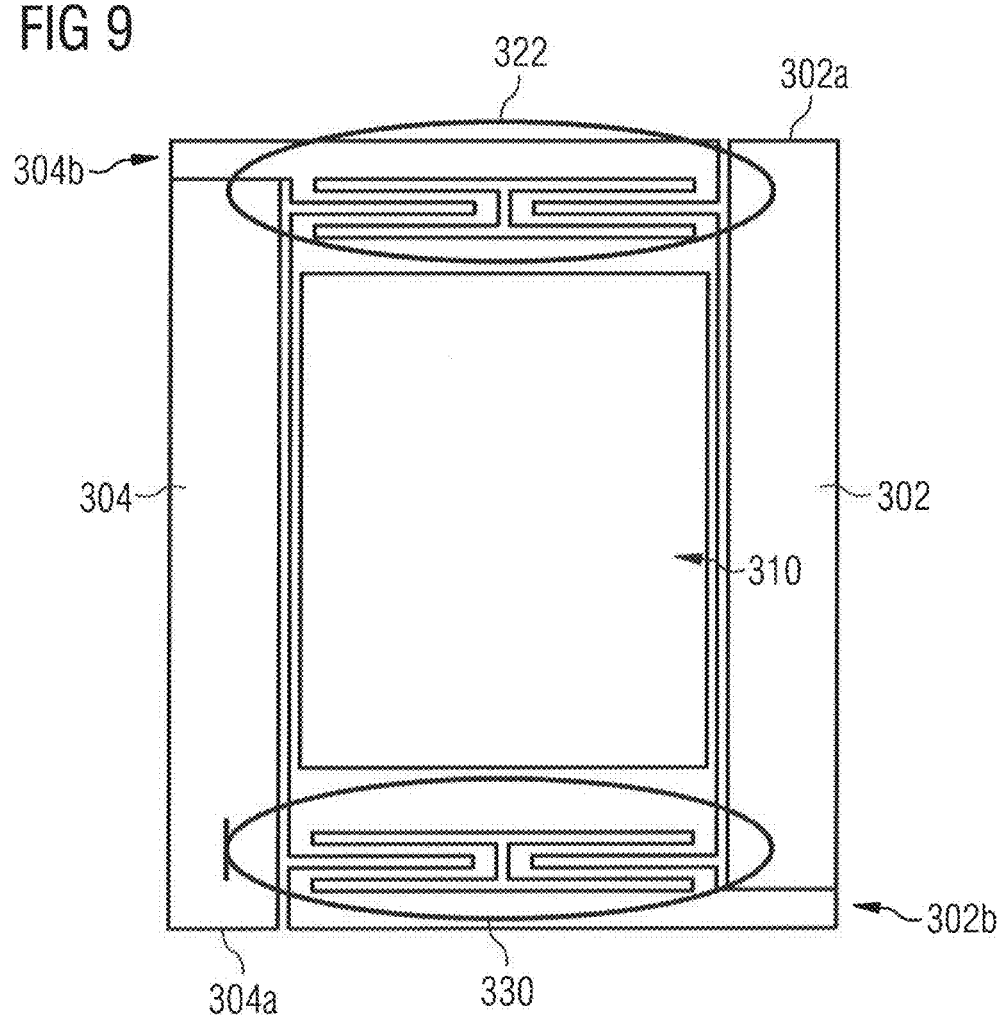
FIG. 9 shows a schematic top view of portions of the substrate of the sensor shown in FIG. 8.

FIG. 9 shows a schematic top view of the semiconductor layer, in which the cantilever beams 302, 304 and the membrane 310 are formed. First ends 302a and 304a of the cantilever beams may be fixed to the substrate 220. A second end 302b of the cantilever beam 302 is mechanically connected to the membrane 310 via a spring structure 330 and a second end 304b of the cantilever beam 304 is mechanically connected to an opposite end of the membrane 310 via a spring structure 332. The first counter electrode 320 is facing a portion of the deflectable membrane 310 in a vertical direction and the second counter electrode 322 is facing another portion of the deflectable membrane 310 in a vertical direction. Accordingly, a first capacitance is formed between the first counter electrode 320 and the deflectable electrode 310 and a second capacitance is formed between the second counter electrode 322 and the deflectable electrode 310. Again, there is a series connection between the first and second capacitances through the conductive doped silicon layer 312 forming the deflectable electrode.

One end 302a, 304a of the cantilever beams 302 may be mechanically fixed to the substrate 220. In examples, the ends 302a, 304a may be mechanically fixed via oxide bridges or oxide pylons. The other sides 302b, 304b of the bimaterial cantilevers are attached to different sides of the membrane 310. Mechanical rotational springs 330 and 332 may be provided to insure maximum deformation of the cantilever beams by decoupling with respect to rotation the ends 302b, 304b from the membrane 310, which forms a stiffer middle part. As can be imagined from FIG. 11, due to the rotational springs 330, 332, the membrane 310 may have a flat profile which may be optimum for readout and which may contribute to a highest possible output signal. In other words, the rotational springs 330, 332 hold the metal membrane 310 while allowing the whole structure to relax thus encouraging greater swing and flatter profile.

Figure 11:
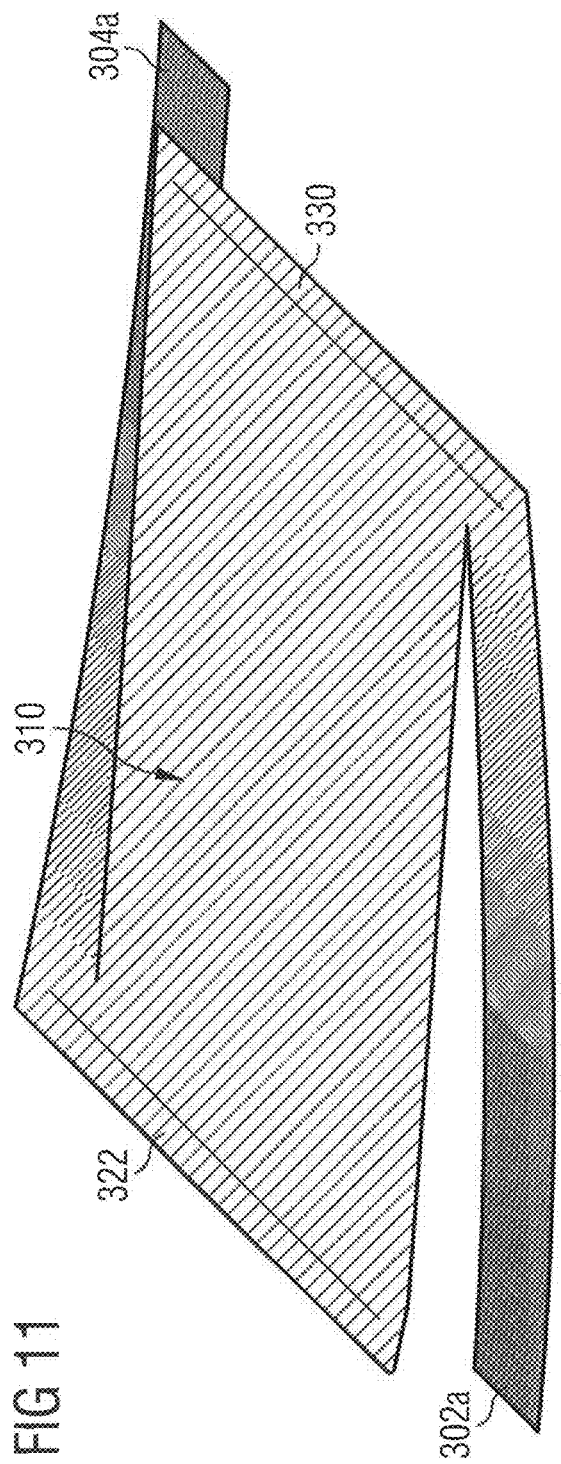
FIG. 11 shows a schematic view of a membrane and support structures of the sensor shown in FIG. 8.
Figure 12:
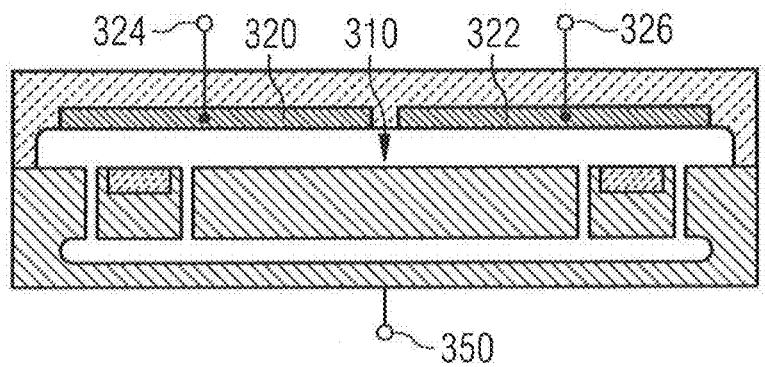
FIG. 12A to FIG. 12C show schematic cross-sectional views showing different operational states of the sensor of FIG. 8.
Figure 12:
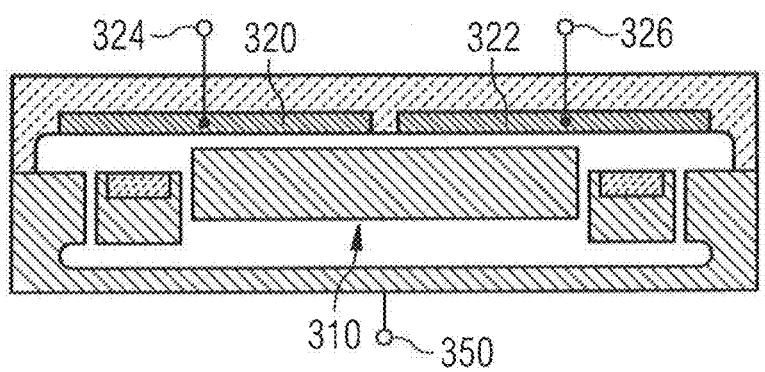
Figure 12:
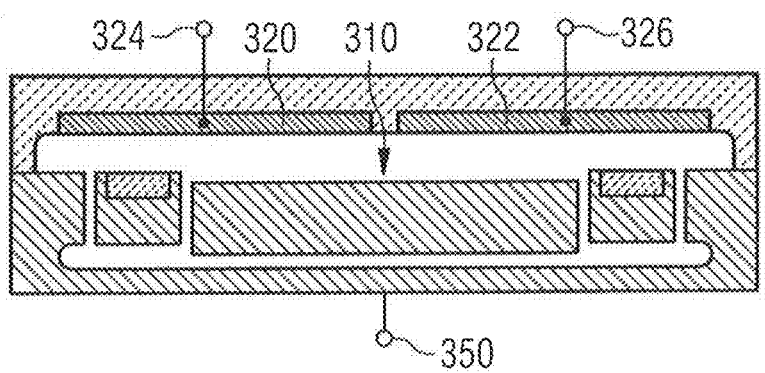

The membrane 310 is formed of heavily doped semiconductor, such as silicon, and is used as a movable floating contact for sensing, readout and IR absorption. The cantilever beams 302, 304 comprise in this example the composite of two layers of materials having different coefficients of thermal expansion to convert temperature changes to mechanical deformations. In examples, the cantilever beams may be bimaterial cantilever beams comprising a silicon layer and a deposited oxide layer. Infrared radiation incident into the membrane 310 may result in a rise of temperature of the membrane 310, which, in turn, may result in a rise of temperature of the cantilever beams 302, 304 and, therefore, in a mechanical deformation thereof. This deformation of the cantilever beams 302, 304 results in a deflection of the membrane 310 as shown in FIG. 11. This deflection results in a change of capacitance, which may be detected by a detection circuit connected to the counter electrodes 320, 322. Accordingly, the cantilever beams may be regarded as representing a bimaterial pair configured to convert heat generated in the membrane to a vertical displacement thereof.

The lid 326 may be a silicon oxide lid and may seal the cavity in which the deflectable electrode is arranged. Thus, a vacuum cavity may be formed to ensure minimum thermal losses. The cavity 222 may be formed by a Venezia cavity allowing electrical and thermal insulation of the membrane from the substrate.

Figure 13A:
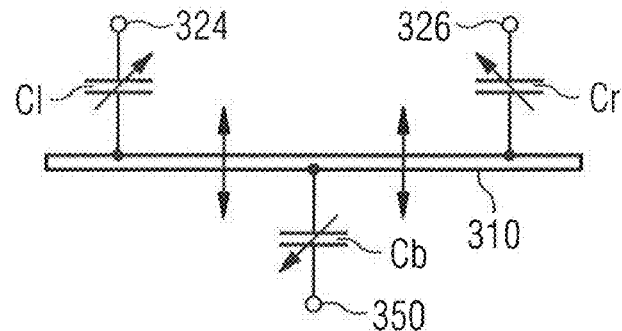
FIG. 13A and FIG. 13B show equivalent circuits of a sensor as shown in FIG. 8.
Figure 13B:
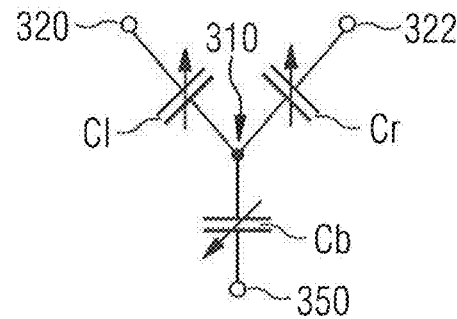

FIGS. 12A to 12C show the sensor of FIGS. 8 to 11 in different operational states. In FIG. 12A, the membrane is in the non-deflected state, such as the equilibrium state. In FIG. 12B, the membrane in deflected upwardly when the membrane is heated. In FIG. 12C, the membrane in deflected downwardly. This state may be achieved when the membrane is cooled down starting from the non-deflected state. FIG. 13A shows an equivalent circuit including a variable capacitance Cn between the counter electrode 320 and the membrane 310, a variable capacitance Cr between the counter electrode 322 and the membrane 310 and a variable capacitance Cb between the membrane and the bulk of the substrate below the membrane. The contact 324 of the first counter electrode 320, the contact 326 of the second counter electrode 322 and a bulk contact 350 are also shown in FIG. 13A. FIG. 13B shows a corresponding equivalent circuit, wherein the membrane 310, which is formed of highly doped conductive semiconductor material, is collapsed to a circuit node.

Since the membrane 310 is floating, the overall charge within the membrane remains the same and, therefore, electrostatic forces will be balanced at any time. Thus, the risk that pull-in effects will occur may be reduced.

FIGS. 14A to 16B show schematic views and equivalent circuits to explain examples of possible detection circuits. In all examples, the bulk contact is connected to ground.

Figure 14A:
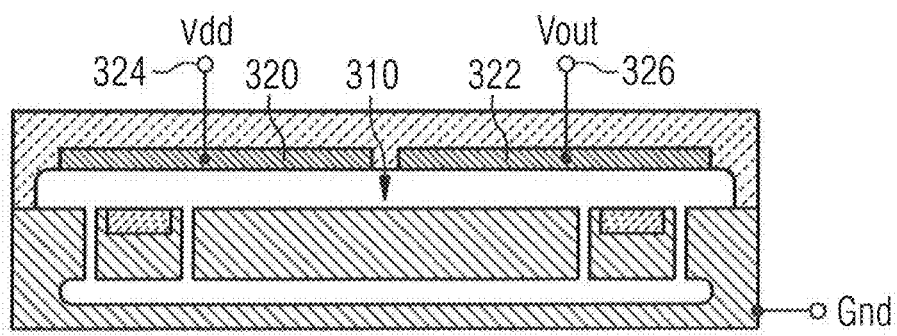
FIG. 14A and FIG. 14B show a schematic view and an equivalent circuit to explain an example of a detection circuit.
Figure 14B:
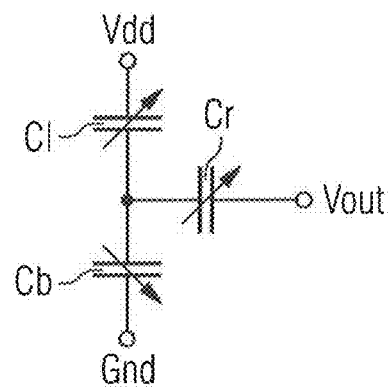

According to FIG. 14A, a supply voltage Vdd is applied to contact 324 and, therefore, the first counter electrode 320, and an output voltage Vout is detected at contact 326. The output voltage 326 depends on the deflection of the membrane 310 and, therefore, represents a measure for the incident infrared radiation. Accordingly, FIGS. 14A to 14B may be regarded as showing a single-ended readout with no pull-in.

Figure 15A:
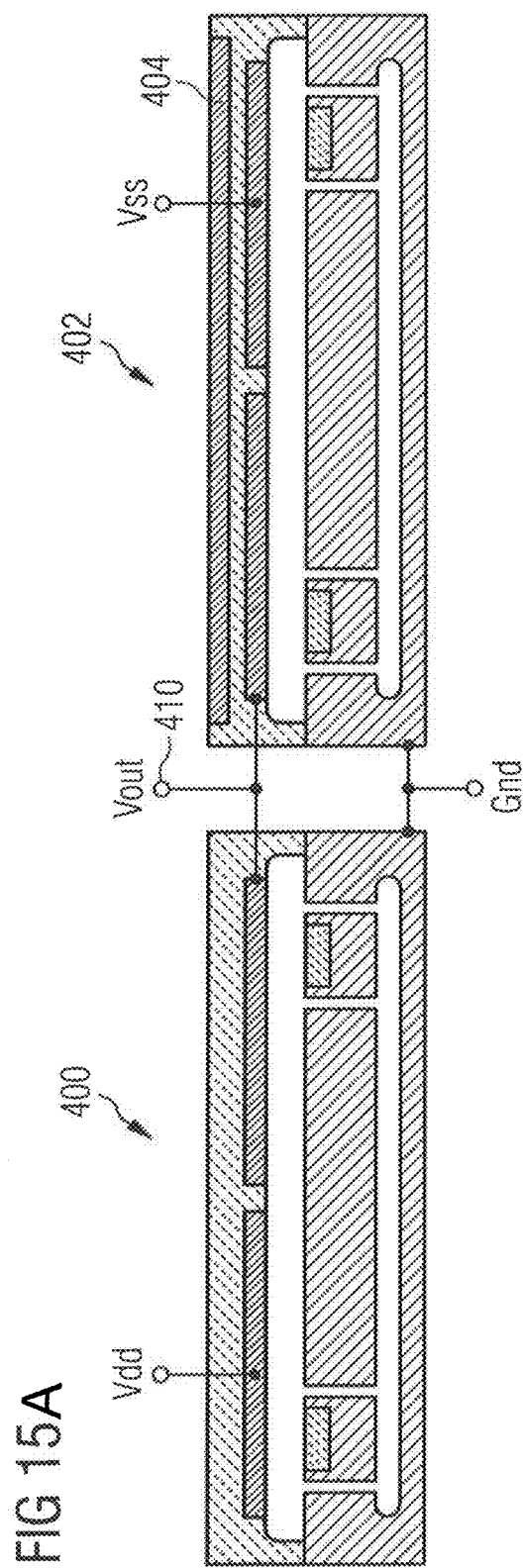
FIG. 15A and FIG. 15B show a schematic view and an equivalent circuit to explain another example of a detection circuit.
Figure 15B:
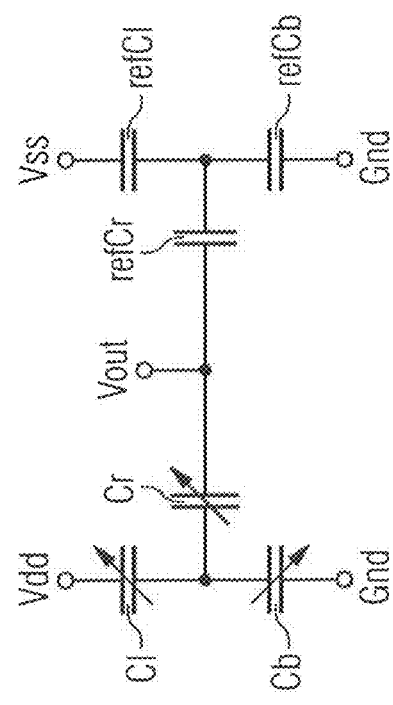

FIGS. 15A to 15B show a readout using reference pixel offset cancellation and pull-in cancellation for symmetric supply. An infrared radiation sensor 400 comprises a structure as described above with respect to FIGS. 8 to 11. A reference structure 402 comprises a similar structure. However, a shielding layer 404 is provided so that there is no infrared radiation incident onto the membrane of the reference structure 402. A supply voltage Vdd is applied to one counter electrode of the sensor structure 400 and a supply voltage Vss is applied to one counter electrode of the reference structure 402. The other counter electrodes are connected to each other and to an output contact 410. The output voltage Vout is detected at the output contact 410. As shown in FIG. 15B, the capacitances of the sensor structure 400 are variable depending on the infrared radiation and the capacitances of the reference structure do not change due to the shielding layer 404.

Figure 16A:
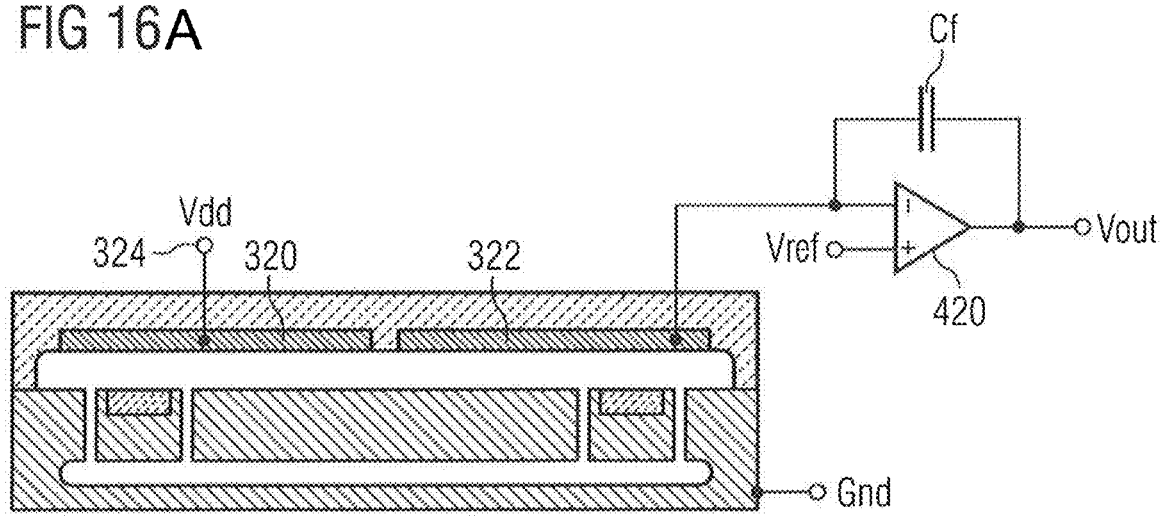
FIG. 16A and FIG. 16B show a schematic view and an equivalent circuit to explain still another example of a detection circuit.
Figure 16B:
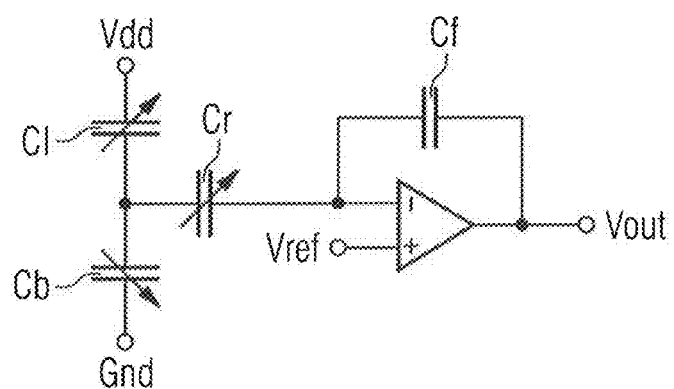

FIGS. 16A to 16B show a direct sensor and reference integration into an inverting amplifier with capacitive feedback. The supply voltage Vdd is applied to the first counter electrode 320 via contact 324. The voltage at the second counter electrode is applied to a first input of a differential amplifier 420. A reference voltage is applied to a second input of the differential amplifier 420. The output voltage Vout of the amplifier 420 represents a measure for the infrared radiation incident on the sensor. The output of the differential amplifier is connected to the first input of the differential amplifier 420 via a feedback capacitor Cf. The output of the differential amplifier depends on the relationship between the feedback capacitor Cf and the capacitance at the first input of the differential amplifier 420 and, therefore, is a measure for the incident infrared radiation.

While FIGS. 14A to 16B have been described in connection with an infrared radiation sensor as shown in FIGS. 8-11, it is clear that a corresponding readout may also take place with the other examples of infrared radiation sensors described herein. In addition, any other circuitry for detecting the respective capacitance or changes in the respective capacitance may be used.

In examples of the present disclosure, thermal insulation of the deflectable electrode may be improved since thermally insulating materials may be used to mechanically contact the sensing membrane. In examples, mechanical springs may encourage maximum displacement of cantilever beams and a maximum possible average displacement of a conducting membrane. In examples, using an electrically insulated and "floating" structure may eliminate the effect of pull-in, since the top and bottom electrostatic forces may always be balanced. Spring systems as described in the context of examples of the present disclosure may work most efficiently when all electrostatic effects are compensated, so that there is a reduced pull-in thread.

In examples, the sensor structure as described herein may be integrated in a substrate or a chip along with a readout circuit. Examples of the present disclosure relate to infrared radiation sensors that may be implemented in MEMS technology using CMOS compatible materials and processes.

Examples relate to methods of making an infrared radiation sensor, in which a layer arranged over a cavity in a substrate is produced, wherein the layer comprises an absorber layer. A deflectable electrode or a deflectable electrode and a support structure for the deflectable electrode are produced by structuring the layer. A composite comprising at least two layers of materials having different coefficients of thermal expansion is produced on the deflectable electrode or the support structure before or after structuring the layer. A first counter electrode facing the deflectable electrode is produced so that a first capacitance is formed between the first counter electrode and the deflectable electrode. A second counter electrode facing the deflectable electrode is produced so that a second capacitance is formed between the second counter electrode and the deflectable electrode. The deflectable electrode is floating, i.e. there is not provided any galvanic connection to the deflectable electrode.

Examples provide a method of making an infrared radiation sensor in which a layer arranged over a cavity in a substrate is produced. A deflectable electrode is produced by structuring the layer, wherein at least one lateral face of the layer surrounding the deflectable electrode forms a counter electrode, which faces a lateral face of the deflectable electrode. A lateral capacitance is formed between the lateral faces which face each other laterally. A composite comprising at least two layers of materials having different coefficients of thermal expansion is produced on the deflectable electrode before or after structuring the layer.

Examples of methods for manufacturing infrared radiation sensors as shown in FIGS. 3B and 5 are now described referring to FIGS. 17A to 17L. It goes without saying that corresponding steps may also be conducted in manufacturing infrared radiation sensors according to other examples described herein.

Figure 17:
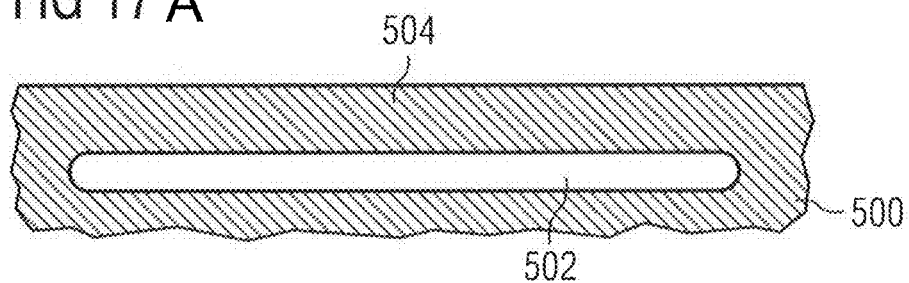
FIG. 17A to FIG. 17L show schematic cross-sectional views of steps of examples of methods of manufacturing infrared radiation sensors.
Figure 17:
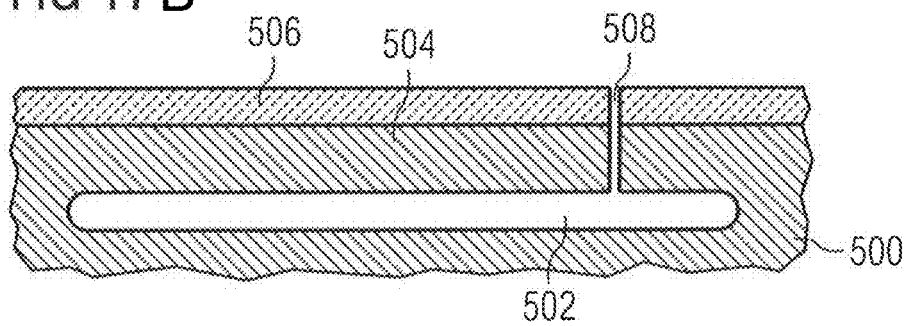
Figure 17:
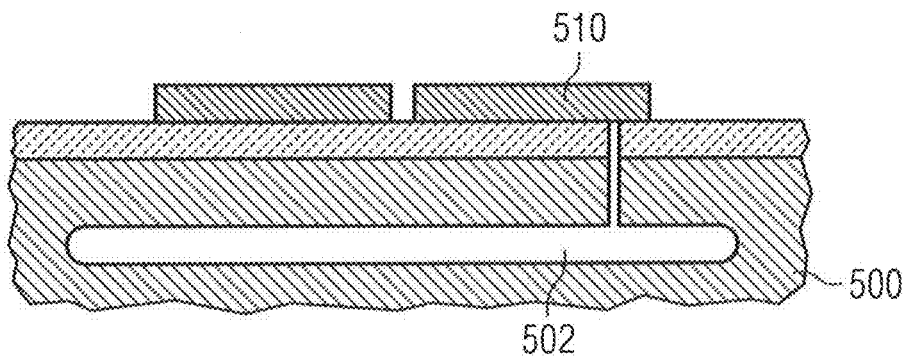

As shown in FIG. 17A, a semiconductor substrate 500 comprising a cavity 502 so that a semiconductor layer 504 is arranged above the cavity 502 is prepared. At least the semiconductor layer 504 may be highly doped. The cavity 502 may be formed by a so-called Venezia process. The Venezia process may comprise etching trenches in a surface of the semiconductor substrate, annealing the semiconductor substrate in a H atmosphere in order to cause the semiconductor material to reflow so that the bottoms of the trenches are joined and the top portions of the trenches are closed so as to form a buried cavity beneath the surface of the semiconductor substrate. In other examples, the cavity 502 may be formed using a sacrificial layer process. The substrate 500 may be a silicon substrate.

Figure 17D:
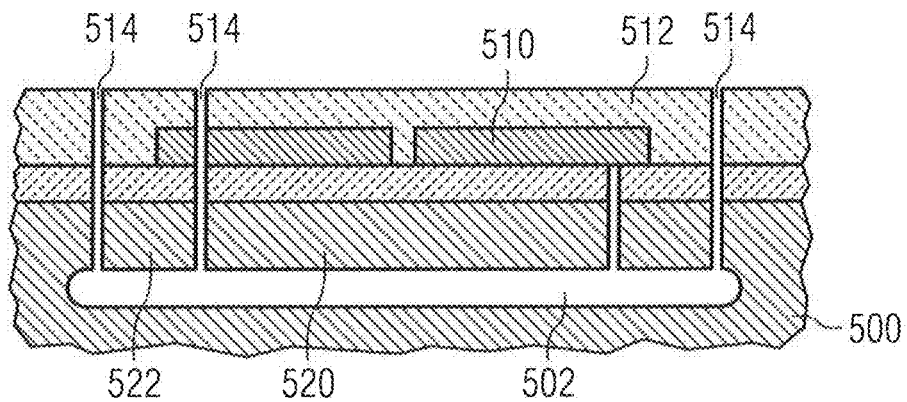
Figure 17E:
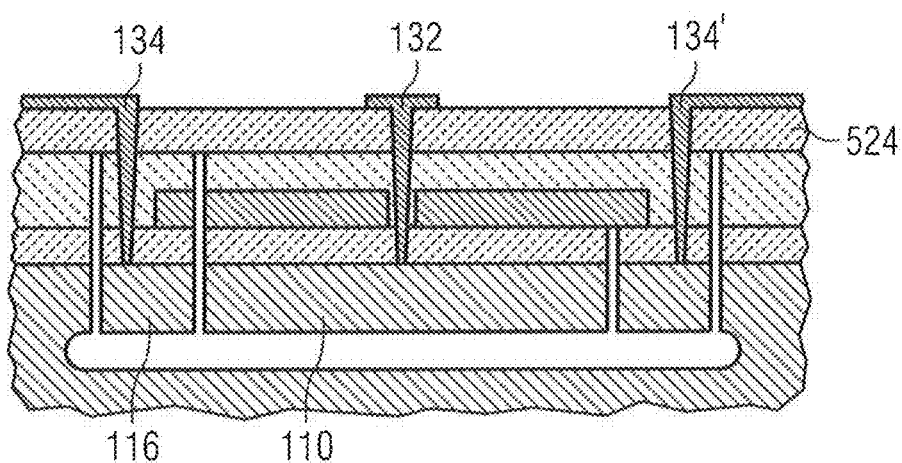

As shown in FIG. 17B, an oxide layer 506 is generated on the substrate 500 to cover the semiconductor layer 504. The oxide layer 500 may be deposited using chemical vapor deposition at increased temperatures of 400 to 500° C. so that a pre-deflection of a membrane to be generated may take place after cooling down to room temperature. Thereupon, a first deep trench etch takes place to generate a first deep trench 508. Thereafter, a sacrificial layer 510 is applied and structured, see FIG. 17C. The sacrificial layer is removed later to form the bottom cavity above the deflectable electrode. In examples, the sacrificial layer may be a carbon layer. Thereupon, a further oxide layer 512 is deposited, such as by chemical vapor deposition. Planarization may take place to remove unevenness of the surface of oxide layer 512. For example, chemical-mechanical polishing may be performed to reduce or remove surface unevenness. Thereupon, a second deep trench etch takes place as shown in FIG. 17D. Thus, further deep trenches 514 are formed to structure the semiconductor layer 504 to achieve the membrane structures 520 and counter electrode structures 522 within the semiconductor layer. In the second deep trench etch, the semiconductor layer 504 may be structured to obtain a single counter electrode 116 (as shown in FIG. 3B) or separate counter electrodes 116a, 116b, as shown in FIG. 5.

FIGS. 17E to 17H relate to a process for manufacturing an infrared radiation sensor as shown in FIG. 3B, in which the membrane 110 comprises an external contact. To this end vias are etched reaching to the counter electrode 116 and the membrane 110. The vias may be filled with conductive material, such as tungsten. Thereafter, a metallization may take place to form a contact 134 for the counter electrode 116 and a contact 132 contacting the membrane 110. While FIGS. 17E to 17H show a symmetric structure with two counter electrode contacts 134, 134', a single contact may be sufficient. During this process, an additional oxide layer 524 may be formed on top of oxide layer 512.

Figure 17F:
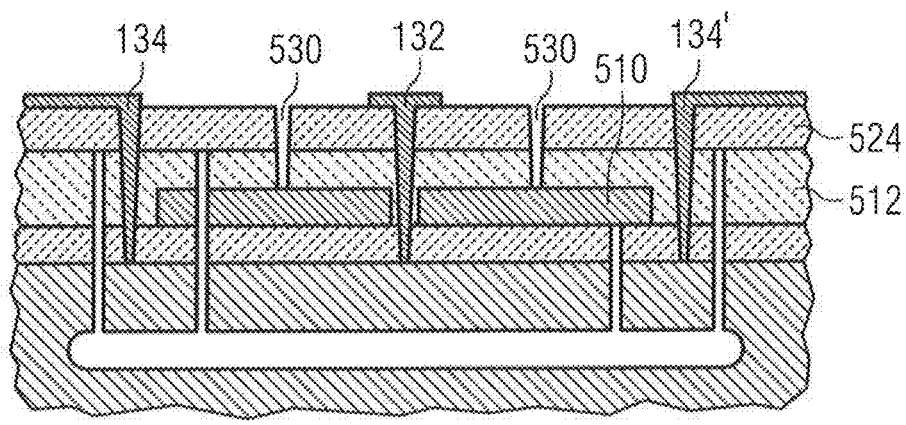
Figure 17G:
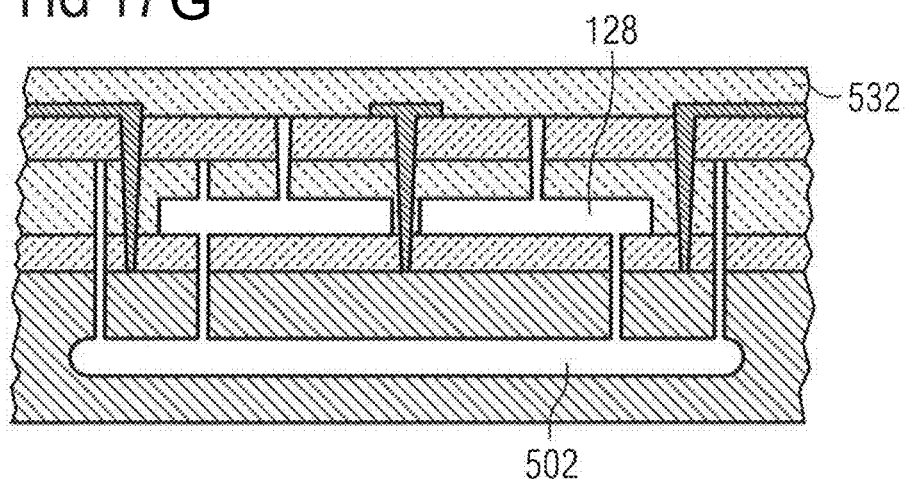
Figure 17H:
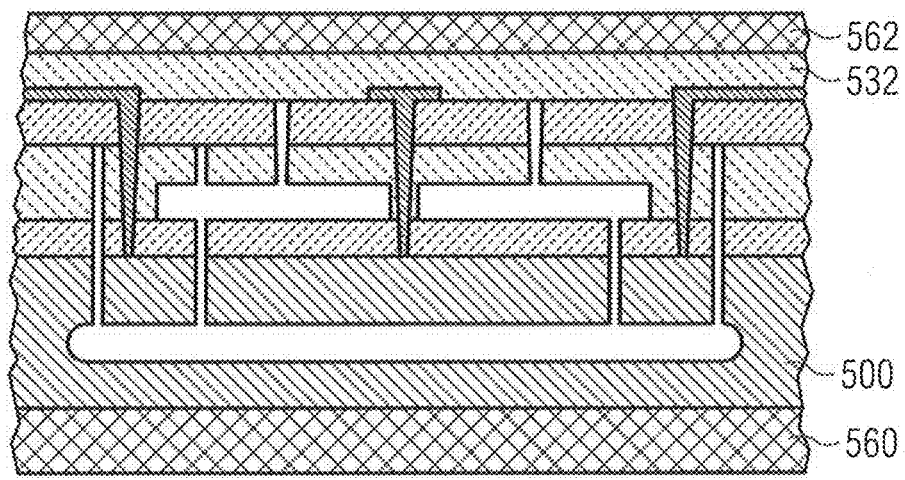
Figure 17I:
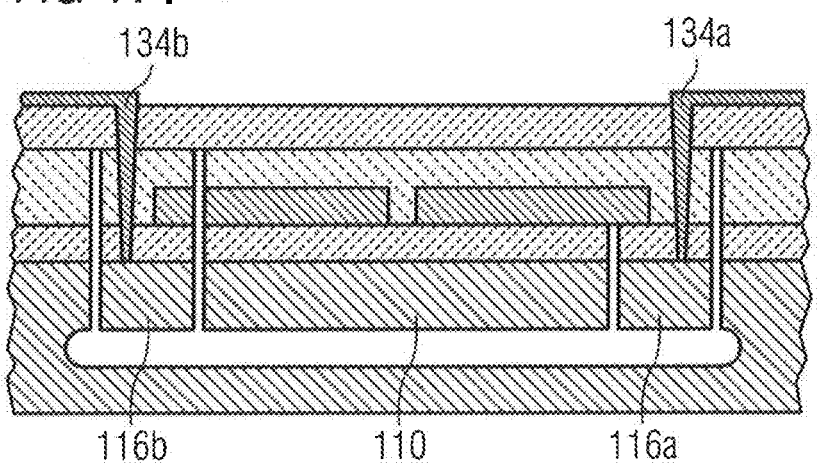
Figure 17J:
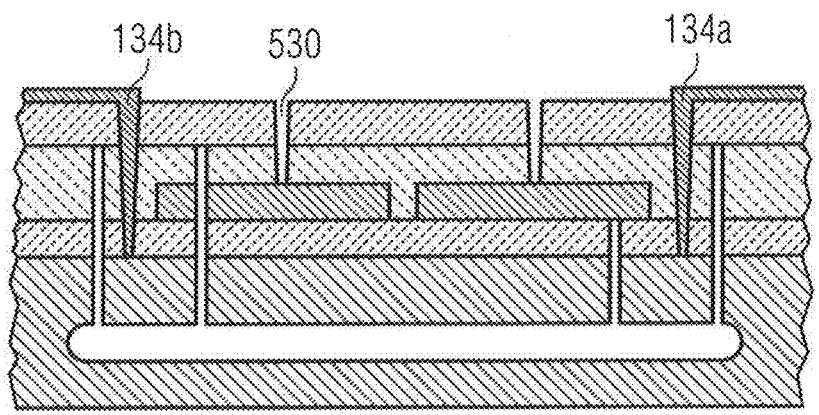
Figure 17K:
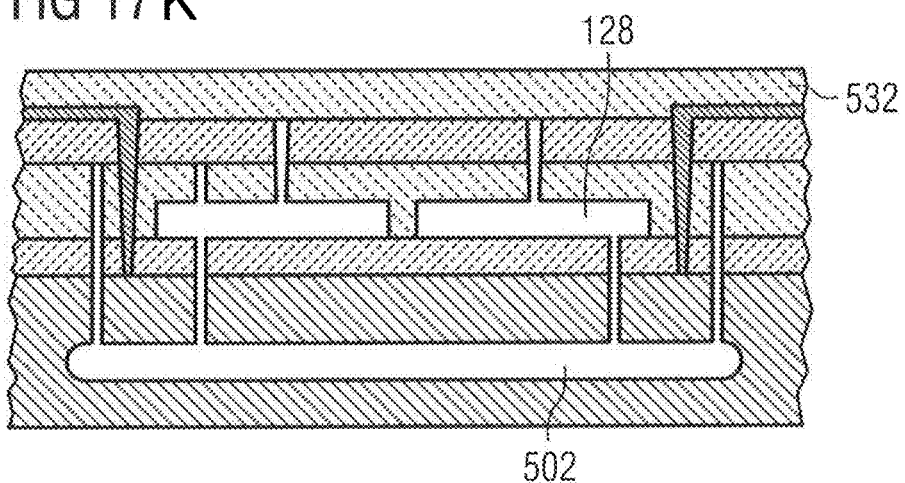
Figure 17L:
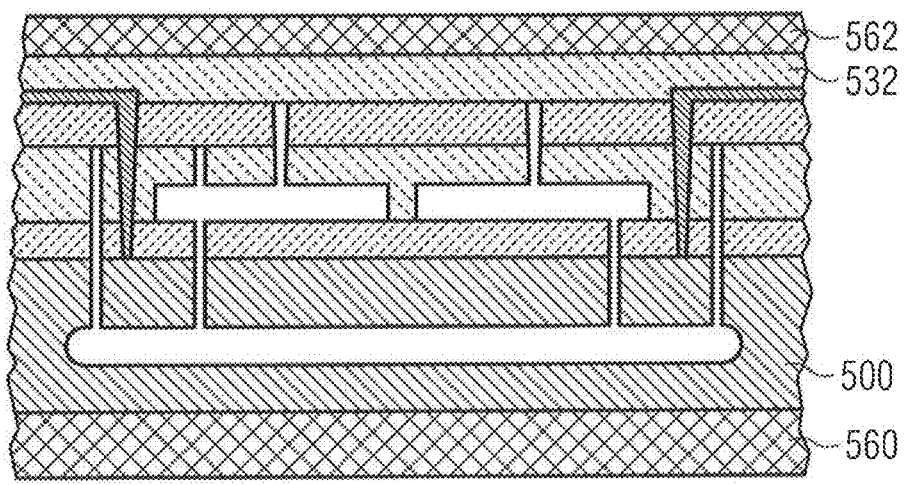

Thereupon, openings 530 reaching to the sacrificial layer 510 are formed through the oxide layers 512 and 524, as shown in FIG. 17F. The sacrificial layer 510 is removed through the openings 530 to generate the cavity 128 above the membrane. Thereupon, an additional oxide layer 532 is applied to seal the cavities 128 and 502. Finally, an optical filter 562 may be applied on the oxide layer 532, and an optical reflector 560 may be applied to the backside of the substrate 500.

The contacts 132, 134 may be coupled to external circuitry.

FIGS. 17I to 17L show part of a process suitable in manufacturing an infrared radiation sensor as shown in FIG. 5, which follows the process shown in FIGS. 17A-17D. The process shown in FIGS. 17I-17L is different from the process shown in FIGS. 17E to 17H in that a contact to the membrane 110 is not formed. Rather, two separate contacts 134a and 134b are formed to both counter electrodes 116a and 116b. For the rest, the process is similar to the process described referring to FIGS. 17E to 17H.

In examples, the composite is a layer composite comprising at least two layers of materials having different coefficients of thermal expansions and being in direct mechanical contact to each other. In examples, one layer may be formed by a doped semiconductor layer, such as silicon or germanium. In examples, the other layer may be formed by an oxide layer, such as a silicon oxide, silicon dioxide or germanium oxide. In examples, the first layer is doped silicon and the second layer is silicon dioxide, wherein the coefficient of thermal expansion of silicon is almost five times higher than that of silicon oxide or silicon dioxide. Thus, a substantial deflection can be achieved in case of a rise in temperature.

Examples provide an infrared camera comprising an array of infrared radiation sensors as disclosed herein. Generally, the size of the membrane will influence the sensitivity of the sensor element since the larger the size of the membrane, the larger the change of the active area of the capacitor due to a mechanical deformation of the membrane will be. Accordingly, examples may be directed to sensors having a high sensitivity. Such sensors may be useful as sensor elements in $CO_2$ sensors, in which a sensitivity of 1 mK is desired. In other applications, the sensor elements may be downscaled to a reduced size in order to implement small infrared cameras having a high resolution.

In examples, the composite comprises two layers of materials having different coefficients of thermal expansions. In other examples, the composite may have more than two layers of materials having different coefficients of thermal expansion, wherein such examples may have an increased sensitivity.

In examples described herein, an oxide layer of the composite may act as a filter stack deposition on the semiconductor layer. In examples, bimaterial parts are only in the cantilever beams and do not contribute to optical performance. In such examples, a filter stack may be applied on top of the lid. In examples, an oxide layer may be deposited over the whole semiconductor membrane and may be used as an anti-reflection coating. In examples, in which oxide is deposited on the cantilevers only and the surface of the membrane is not covered with an oxide layer, optical components may be included in the lid. In examples, a Venezia process may be used to generate the semiconductor layer, in which the membrane is formed. The Venezia process may permit membranes having little or no charges to be formed. Otherwise, additional charges trapped in deposited layers may be a source of misbalance. Accordingly, using the Venezia process may help in creating a balanced system and may help in reducing mechanical stress so that the overall mechanical performance may be improved.

In examples, the deflectable electrode is deflectable vertically with respect to the substrate plane. In such examples, a membrane plane defined by main surfaces of the membrane in a non-deflected state may be arranged in parallel to the substrate plane. In other examples, the deflectable electrode may be deflectable laterally with respect to the substrate plane. In such examples, a membrane plane defined by main surfaces of the membrane may be vertical to the substrate plane.

Although some aspects have been described as features in the context of an apparatus, it is clear that such a description may also be regarded as a description of corresponding features of a method, such as a method for manufacturing such an apparatus or a method for operating such an apparatus. Although some aspects have been described as features in the context of a method, it is clear that such a description may also be regarded as a description of corresponding features concerning the functionality of an apparatus.

In the detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, an inventive subject-matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject-matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the dependent claim.

The above-described examples are merely illustrative for the principles of the present disclosure. It is understood that modifications and variations of the arrangements and the details described herein will be apparent to those skilled in the art. It is the intent, therefore, to be limited by the scope of the impeding patent claims and not by the specific details presented by way of description and explanation of the examples herein.

What is claimed is:

1. An infrared radiation sensor, comprising:
   a substrate;
   a first counter electrode;
   a second counter electrode; and
   a membrane fixed to the substrate,
   at least a portion of the membrane forming a deflectable electrode,
   the deflectable electrode being electrically floating, and
   the membrane comprising:

a composite comprising at least two layers of materials having different coefficients of thermal expansion,
   wherein a first capacitance is formed between the deflectable electrode and the first counter electrode, and
   wherein a second capacitance is formed between the deflectable electrode and the second counter electrode; and
an absorption region configured to cause deformation of the composite by absorbing infrared radiation,
   the deformation resulting in a deflection of the deflectable electrode, which causes a change of the first capacitance and the second capacitance.

2. The infrared radiation sensor of claim 1, further comprising:
a detection circuit configured to output a detection signal indicating the change of the first capacitance and the second capacitance.

3. The infrared radiation sensor of claim 1, wherein the portion of the membrane forming the deflectable electrode is deflectable vertically with respect to a substrate plane defined by at least one main surface of the substrate, and
   wherein the deformation causes a vertical deflection of the portion of the deflectable electrode relative to the first counter electrode and the second counter electrode.

4. The infrared radiation sensor of claim 1, wherein the deflectable electrode and the first counter electrode face each other vertically with respect to a substrate plane, and
   wherein the deflectable electrode and the second counter electrode face each other vertically with respect to the substrate plane.

5. The infrared radiation sensor of claim 4, wherein the membrane is supported at the substrate by the composite,
   wherein the composite comprises a first cantilever beam and a second cantilever beam,
      wherein the first cantilever beam and the second cantilever beam bears the membrane, and
      wherein an end of the first cantilever beam is coupled to a first side of the membrane an end of the second cantilever beam is coupled to a second side of the membrane, which is opposite to the first side in a lateral direction with respect to the substrate plane.

6. The infrared radiation sensor of claim 5, wherein the end of the first cantilever beam and the end of the second cantilever beam are coupled to the membrane by respective mechanical springs,
   wherein a mechanical spring, of the respective mechanical springs, decouples the membrane from the first cantilever beam or the second cantilever beam with respect to rotation.

7. The infrared radiation sensor of claim 1, wherein the membrane and a first layer of the composite are formed in a doped semiconductor layer.

8. The infrared radiation sensor of claim 1, wherein the first counter electrode and the second counter electrode are arranged to face different portions of the deflectable electrode vertically with respect to a substrate plane.

9. The infrared radiation sensor of claim 1, further comprising:
a lid sealing a cavity in which the deflectable electrode is formed,
   wherein the first counter electrode and the second counter electrode are formed on the lid.

10. The infrared radiation sensor of claim 1, further comprising:

a membrane support,
   wherein the membrane support is coupled to the membrane in a region spaced from lateral margins of the membrane when viewed in a plan view orthogonal to a substrate plane.

11. The infrared radiation sensor of claim 10, wherein the membrane comprises trenches reducing a thermal influence of the region on other regions of the membrane.

12. The infrared radiation sensor of claim 10, wherein the membrane support is coupled to the membrane in a central region of the membrane in the plan view orthogonal the substrate plane.

13. The infrared radiation sensor of claim 1, wherein the deflectable electrode and the first counter electrode face each other laterally with respect to a substrate plane, and
   wherein the deflectable electrode and the second counter electrode face each other laterally with respect to the substrate plane.

14. The infrared radiation sensor of claim 1, wherein portions of the deflectable electrode, the first counter electrode, and the second counter electrode, are meander shaped in a plan view orthogonal to a substrate plane.

15. The infrared radiation sensor of claim 1, wherein a first layer of the membrane is formed in a doped semiconductor layer of the substrate, and
   wherein the first counter electrode and the second counter electrode are formed in the doped semiconductor layer and separated from the membrane by trenches.

16. An infrared radiation sensor comprising:
a substrate having a main surface defining a substrate plane;
a membrane formed fixed to the substrate,
   at least a portion of the membrane forming a deflectable electrode, and
   wherein the membrane comprises:
      a composite comprising:
         at least two layers of materials having different coefficients of thermal expansion, and
         an absorption region configured to cause deformation of the composite by absorbing infrared radiation, and
      trenches reducing a thermal influence of a region, of the membrane coupled to a membrane support, on other regions of the membrane; and
a counter electrode,
   wherein the deflectable electrode and the counter electrode face each other laterally with respect to the substrate plane,
   a capacitance being formed between the deflectable electrode and the counter electrode, and
   wherein the deformation results in a deflection of the deflectable electrode relative to the counter electrode, which causes a change of the capacitance.

17. The infrared radiation sensor of claim 16, wherein the counter electrode laterally faces the deflectable electrode at lateral margins of the deflectable electrode,
   wherein the region of the membrane coupled to the membrane support is spaced from the lateral margins when viewed in a plan view orthogonal to the substrate plane.

18. The infrared radiation sensor of claim 17, wherein the membrane support is coupled to the membrane in a central region of the membrane in the plan view orthogonal to the substrate plane.

19. The infrared radiation sensor of claim 16, wherein a margin, of the deflectable electrode and a portion of the counter electrode facing the deflectable electrode, is meander shaped in a plan view orthogonal to the substrate plane.

20. The infrared radiation sensor of claim 16, wherein a first layer of the membrane is formed in a doped semiconductor layer, and
    wherein the counter electrode is formed in the doped semiconductor layer and separated from the membrane by the trenches.

21. A method of manufacturing an infrared radiation sensor, comprising:
    arranging a first layer over a cavity in a substrate,
        wherein the first layer is an absorber layer;
    arranging a second layer over the first layer,
        wherein the second layer has a different coefficient of thermal expansion than the first layer; and
    generating trenches in the first layer and the second layer to produce a deflectable electrode, a first counter electrode, and a second counter electrode,
        wherein the first counter electrode faces the deflectable electrode with a first capacitance formed therebetween,
        wherein the second counter electrode faces the deflectable electrode with a second capacitance formed therebetween, and
        wherein the deflectable electrode is not provided with an electric connection.

22. The method of claim 21, wherein a margin, between the first counter electrode and the deflectable electrode, is meander shaped in a plan view orthogonal to a substrate plane.

23. The method of claim 21, further comprising:
    forming a support structure for the deflectable electrode.

* * * * *

UNITED STATES PATENT AND TRADEMARK OFFICE
CERTIFICATE OF CORRECTION

PATENT NO. : 11,015,980 B2
APPLICATION NO. : 16/194674
DATED : May 25, 2021
INVENTOR(S) : Vladislav Komenko Page 1 of 1

It is certified that error appears in the above-identified patent and that said Letters Patent is hereby corrected as shown below:

In the Claims

In Claim 5, Column 17, Line 42, "to a first side of the membrane an end of the second" should be changed to --to a first side of the membrane and an end of the second--

In Claim 16, Column 18, Line 30, "An infared radiation sensor comprising:" should be changed to --An infared radiation sensor, comprising:--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*